(12) United States Patent
Lin

(10) Patent No.: US 12,419,062 B2
(45) Date of Patent: Sep. 16, 2025

(54) METHOD FOR MANUFACTURING SEMICONDUCTOR DEVICE INCLUDING CAPACITOR STRUCTURE HAVING LOWER ELECTRODE WITH DIFFERENT LENGTHS

(71) Applicant: NANYA TECHNOLOGY CORPORATION, New Taipei (TW)

(72) Inventor: Wei-Jie Lin, Taichung (TW)

(73) Assignee: NANYA TECHNOLOGY CORPORATION, New Taipei (TW)

( * ) Notice: Subject to any disclaimer, the term of this patent is extended or adjusted under 35 U.S.C. 154(b) by 670 days.

(21) Appl. No.: 17/856,399

(22) Filed: Jul. 1, 2022

(65) Prior Publication Data

US 2024/0006474 A1  Jan. 4, 2024

(51) Int. Cl.
*H10D 1/00* (2025.01)
*H10D 1/68* (2025.01)

(52) U.S. Cl.
CPC ............. *H10D 1/043* (2025.01); *H10D 1/696* (2025.01); *H10D 1/714* (2025.01); *H10D 1/716* (2025.01)

(58) Field of Classification Search
CPC ........ H10D 1/043; H10D 1/716; H10D 1/714; H10D 1/696
See application file for complete search history.

(56) References Cited

U.S. PATENT DOCUMENTS

2011/0306208 A1  12/2011  Lee et al.
2013/0299942 A1*  11/2013  Park .................. H10D 1/692
                                                         257/532

FOREIGN PATENT DOCUMENTS

TW    201347000 A    11/2013
TW    201904077 A     1/2019
TW    202013483 A     4/2020

* cited by examiner

*Primary Examiner* — Richard A Booth
(74) *Attorney, Agent, or Firm* — MUNCY, GEISSLER, OLDS & LOWE, P.C.

(57) ABSTRACT

The present disclosure provides a method of manufacturing a semiconductor device. The method includes providing a substrate; forming a lower supporting layer on the substrate; forming an upper supporting layer on the lower supporting layer, wherein the upper supporting layer defines an opening; and forming a lower electrode within the opening of the upper supporting layer, wherein the lower electrode has a first portion with a first vertical length and a second portion with a second vertical length different from the first vertical length.

7 Claims, 19 Drawing Sheets

216

2161
Imposing a first temperature on a central region of the substrate and a second temperature different from the first temperature on a peripheral region of the substrate

FIG. 4

METHOD FOR MANUFACTURING SEMICONDUCTOR DEVICE INCLUDING CAPACITOR STRUCTURE HAVING LOWER ELECTRODE WITH DIFFERENT LENGTHS

TECHNICAL FIELD

The present disclosure relates to a method for manufacturing a semiconductor device, and more particularly, to a method for manufacturing a semiconductor device with improved capacitance.

DISCUSSION OF THE BACKGROUND

With the rapid growth of the electronics industry, integrated circuits (ICs) have achieved high performance and miniaturization. Technological advances in IC materials and design have produced generations of ICs with smaller and more complex circuits.

During formation of capacitor structures, multiple etching processes are performed to pattern various layers, such as dielectric layers or metallization layers. In some cases, the uniformity of said layers in a central region and in a peripheral region cannot satisfy the requirement of the process window. In order to solve said problem, a new semiconductor device is proposed.

This Discussion of the Background section is provided for background information only. The statements in this Discussion of the Background are not an admission that the subject matter disclosed herein constitutes prior art with respect to the present disclosure, and no part of this Discussion of the Background may be used as an admission that any part of this application constitutes prior art with respect to the present disclosure.

SUMMARY

One aspect of the present disclosure provides a semiconductor device. The semiconductor device includes a substrate, a lower supporting layer, an upper supporting layer, and a lower electrode. The lower supporting layer is disposed on the substrate. The upper supporting layer is disposed on the lower supporting layer. The upper supporting layer defines an opening. The lower electrode is disposed within the opening of the upper supporting layer. The lower electrode has a first portion with a first vertical length and a second portion with a second vertical length different from the first vertical length.

Another aspect of the present disclosure provides another method of manufacturing a semiconductor device. The semiconductor device includes a substrate, a lower supporting layer, an upper supporting layer, and a lower electrode. The lower supporting layer is disposed on the substrate. The upper supporting layer is disposed on the lower supporting layer. The upper supporting layer defines an opening. The lower electrode is disposed within the opening of the upper supporting layer. The lower electrode has a first upper surface at a first horizontal level and a second upper surface at a second horizontal level different from the first horizontal level.

Another aspect of the present disclosure provides a method of manufacturing a semiconductor device. The method includes: providing a substrate, wherein the substrate comprises a central region and a peripheral region surrounding the central region; forming a lower sacrificial layer, a lower supporting layer, an upper sacrificial layer, and an upper supporting layer on the substrate; forming an opening defined by the lower sacrificial layer, the lower supporting layer, the upper sacrificial layer, and the upper supporting layer; forming a conductive layer on the upper supporting layer and within the opening; forming a cap layer over the conductive layer, wherein the cap layer defines an opening exposing the upper sacrificial layer; removing the upper sacrificial layer to expose the lower supporting layer; and performing an etching process to remove the lower supporting layer, wherein the peripheral region of the substrate is imposed on a first temperature, and the central region of the substrate is imposed on a second temperature different form the first temperature.

The embodiments of the present disclosure provide a semiconductor device. The semiconductor device may include a lower electrode of a capacitor structure. The lower electrode may include a first portion and a second portion with different vertical lengths. The capacitor structure may include a capacitor dielectric on the lower electrode. In this embodiment, the capacitor dielectric may be in contact with the bottom of the lower electrode, which thereby increasing the capacitance of the semiconductor device.

The foregoing has outlined rather broadly the features and technical advantages of the present disclosure in order that the detailed description of the disclosure that follows may be better understood. Additional features and advantages of the disclosure will be described hereinafter, and form the subject of the claims of the disclosure. It should be appreciated by those skilled in the art that the conception and specific embodiment disclosed may be readily utilized as a basis for modifying or designing other structures or processes for carrying out the same purposes of the present disclosure. It should also be realized by those skilled in the art that such equivalent constructions do not depart from the spirit and scope of the disclosure as set forth in the appended claims.

BRIEF DESCRIPTION OF THE DRAWINGS

A more complete understanding of the present disclosure may be derived by referring to the detailed description and claims when considered in connection with the Figures, where like reference numbers refer to similar elements throughout the Figures, and:

FIG. 4 is a flowchart illustrating a method of manufacturing a semiconductor device, in accordance with some embodiments of the present disclosure.

DETAILED DESCRIPTION

Figure 1A:
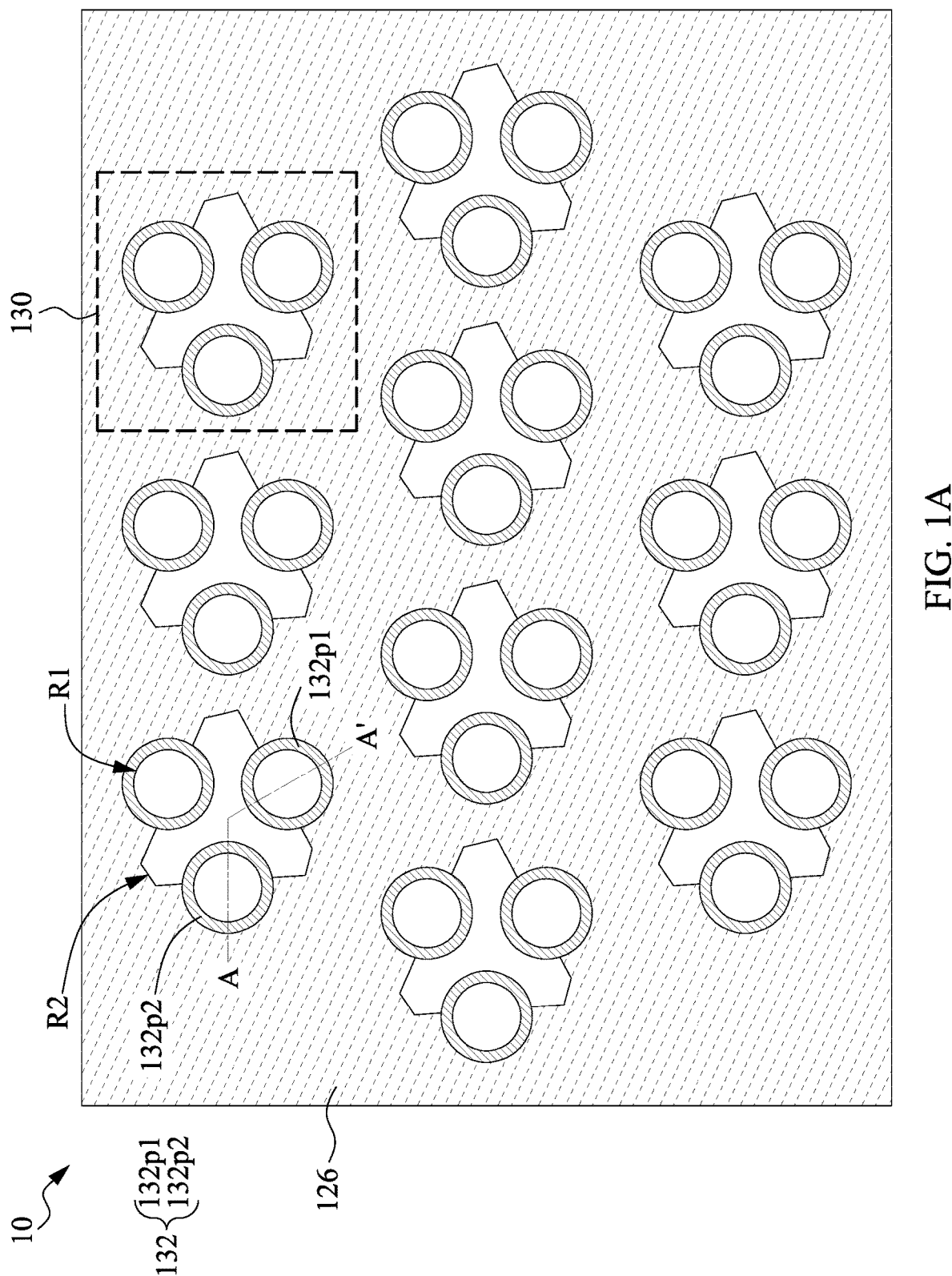
FIG. 1A is a top view of a semiconductor device, in accordance with some embodiments of the present disclosure.

Embodiments, or examples, of the disclosure illustrated in the drawings are now described using specific language. It shall be understood that no limitation of the scope of the disclosure is hereby intended. Any alteration or modification of the described embodiments, and any further applications of principles described in this document, are to be considered as normally occurring to one of ordinary skill in the art to which the disclosure relates. Reference numerals may be repeated throughout the embodiments, but this does not necessarily mean that feature(s) of one embodiment apply to another embodiment, even if they share the same reference numeral.

It shall be understood that, although the terms first, second, third, etc., may be used herein to describe various elements, components, regions, layers or sections, these elements, components, regions, layers or sections are not limited by these terms. Rather, these terms are merely used to distinguish one element, component, region, layer or section from another region, layer or section. Thus, a first element, component, region, layer or section discussed below could be termed a second element, component, region, layer or section without departing from the teachings of the present inventive concept.

The terminology used herein is for the purpose of describing particular example embodiments only and is not intended to be limited to the present inventive concept. As used herein, the singular forms "a," "an" and "the" are intended to include the plural forms as well, unless the context clearly indicates otherwise. It shall be further understood that the terms "comprises" and "comprising," when used in this specification, point out the presence of stated features, integers, steps, operations, elements, or components, but do not preclude the presence or addition of one or more other features, integers, steps, operations, elements, components, or groups thereof.

Figure 1B:
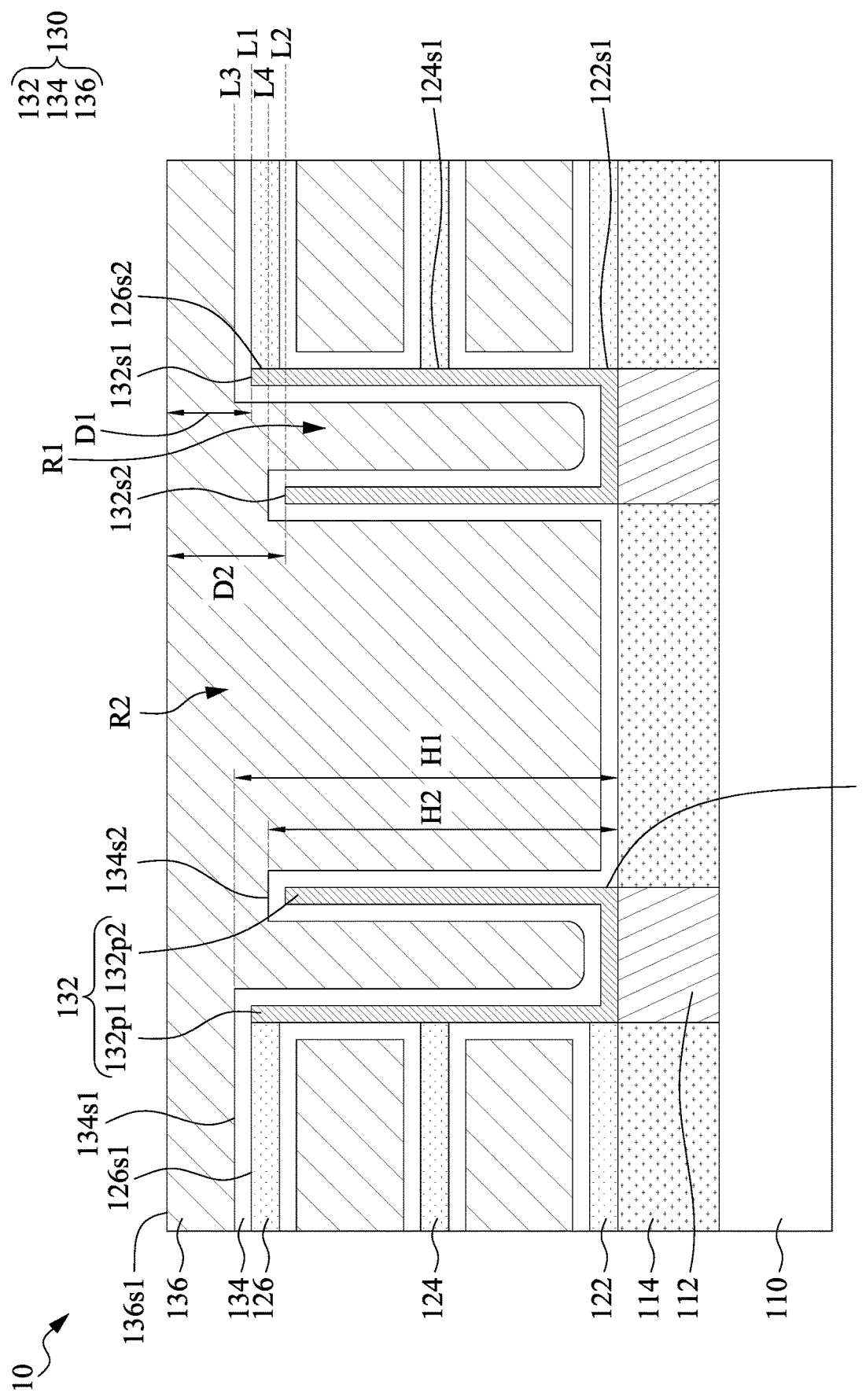
FIG. 1B is a cross-sectional view along line A-A' of the semiconductor device as shown in FIG. 1A, in accordance with some embodiments of the present disclosure.

Referring to FIG. 1A and FIG. 1B, FIG. 1A is a top view of a semiconductor device 10, and FIG. 1B is a cross-sectional view along line A-A' of the semiconductor device 10 as shown in FIG. 1A, in accordance with some embodiments of the present disclosure. It should be noted that some elements or features are omitted from FIG. 1A for brevity.

As shown in FIG. 1A, the semiconductor device 10 may include a plurality of capacitor structures 130. Each of the capacitor structure 130 may include a lower electrode 132 and an upper electrode (not shown in FIG. 1A). In some embodiments, the lower electrode 132 may include a plurality of rings in a top view. In some embodiments, each of the rings may define an opening R1. Although FIG. 1 illustrates the lower electrode 132 has three rings, the present disclosure is not limited thereto. Further, in other embodiments, the lower electrode 132 may have a pillar shape, and no opening is formed within the lower electrode 132.

In some embodiments, the plurality of capacitor structures 130 may be separated at least by a supporting layer 126. In some embodiments, the supporting layer 126 may define an opening R2. In some embodiments, the capacitor structure 130 may be disposed within the opening R2. In some embodiments, the lower electrode 132 of the capacitor structure 130 may be disposed within the opening R2.

As shown in FIG. 1B, the semiconductor device 10 may include a substrate 110. The substrate 110 may be a semiconductor substrate, such as a bulk semiconductor, a semiconductor-on-insulator (SOI) substrate, or the like. The substrate 110 can include an elementary semiconductor including silicon or germanium in a single crystal form, a polycrystalline form, or an amorphous form; a compound semiconductor material including at least one of silicon carbide, gallium arsenide, gallium phosphide, indium phosphide, indium arsenide, and indium antimonide; an alloy semiconductor material including at least one of SiGe, GaAsP, AlInAs, AlGaAs, GaInAs, GaInP, and GaInAsP; any other suitable materials; or a combination thereof. In some embodiments, the alloy semiconductor substrate may be a SiGe alloy with a gradient Ge feature in which the Si and Ge composition changes from one ratio at one location to another ratio at another location of the gradient SiGe feature. In another embodiment, the SiGe alloy is formed over a silicon substrate. In some embodiments, a SiGe alloy can be mechanically strained by another material in contact with the SiGe alloy. In some embodiments, the substrate 110 may have a multilayered structure, or the substrate 110 may include a multilayered compound semiconductor device.

Some elements are formed within or on the substrate 110. For example, a transistor and traces (e.g., the zero metal layer, the first metal layer, and so on) and/or other elements may be formed within or on the substrate 110. The transistor may include a gate structure, a source/drain feature, a channel layer and/or other elements.

The semiconductor device 10 may include contact plugs 112. The contact plug 112 may be electrically connected with a source/drain region (not shown in the figures) formed in the substrate 110. In some embodiments, the contact plug 112 may include metal, such as tungsten (W), copper (Cu), ruthenium (Ru), iridium (Ir), nickel (Ni), osmium (Os), ruthenium (Rh), aluminum (Al), molybdenum (Mo), cobalt (Co), alloys thereof, or a combination thereof.

The semiconductor device 10 may include a dielectric layer 114 (or an interlayer dielectric). Each of the contact plugs 112 may be separated by the dielectric layer 114. The dielectric layer 114 may include, for example, silicon oxide (SiO$_2$), silicon nitride (Si$_3$N$_4$), silicon oxynitride (N$_2$OSi$_2$), silicon nitride oxide (N$_2$OSi$_2$), a high-k material or combinations thereof. The dielectric layer 114 may also be referred to as an interlayer dielectric.

In some embodiments, the semiconductor device 10 may include supporting layers 122, 124, and 126. In some embodiments, the supporting layer 122 may be disposed on the substrate 110. In some embodiments, the supporting layer 122 may be disposed on the dielectric layer 114. In some embodiments, the supporting layer 122 may also be referred to as the bottommost supporting layer.

In some embodiments, the supporting layer 124 may be disposed on the substrate 110. In some embodiments, the supporting layer 124 may be disposed over the supporting layer 122. In some embodiments, the supporting layer 124 may be disposed on the substrate 110. In some embodiments, the supporting layer 124 may also be referred to as a lower supporting layer.

In some embodiments, the supporting layer 126 may be disposed on the substrate 110. In some embodiments, the supporting layer 126 may be disposed over the supporting layer 124. In some embodiments, the supporting layer 126 may also be referred to as upper supporting layer.

In some embodiments, the supporting layers 122, 124, and 126 may be spaced apart from each other. In some embodiments, the supporting layers 122, 124, and 126 may be utilized to define the patterns of a capacitor dielectric and an upper electrode of the capacitor structure 130.

In some embodiments, the supporting layers 122, 124, and 126 may have the same pattern in a top view. Each of the supporting layers 122, 124, and 126 may include silicon oxide (SiO$_2$), silicon nitride (Si$_3$N$_4$), silicon oxynitride (N$_2$OSi$_2$), silicon nitride oxide (N$_2$OSi$_2$), or other suitable materials. In some embodiments, the supporting layers 122, 124, and 126 may have the same material. The supporting layer 122 may have a sidewall 122s1. The supporting layer 124 may have a sidewall 124s1. The supporting layer 126 may have a surface 126s1 (or an upper surface). The supporting layer 126 may have a sidewall 126s2.

In some embodiments, the capacitor structure 130 may be disposed on the substrate 110. In some embodiments, the capacitor structure 130 may include a lower electrode 132, a capacitor dielectric 134, and an upper electrode 136.

In some embodiments, the lower electrode 132 may be disposed on the substrate 110. In some embodiments, the lower electrode 132 may be disposed on the contact plug 112. In some embodiments, the lower electrode 132 may be disposed within the opening R2 defined by the supporting layer 126. In some embodiments, the lower electrode 132 may be disposed on the sidewall 122s1. In some embodiments, the lower electrode 132 may be disposed on the sidewall 124s1. In some embodiments, the lower electrode 132 may be disposed on the sidewall 126s2. In some embodiments, the opening R1 may be surrounded by the lower electrode 132. The lower electrode 132 may include conductive material(s), such as doped poly silicon, conductive metal nitride (e.g., titanium nitride, tantalum nitride, tungsten nitride, or the like), metal (e.g., ruthenium, iridium, titanium, tantalum, or the like), and conductive metal oxide (e.g., iridium oxide or the like).

As shown in FIG. 1A and FIG. 1B, the lower electrode 132 may include a portion 132p1 and a portion 132p2. The portions 132p1 and 132p2 may collectively define a ring-shaped profile in a top view. In some embodiments, the portion 132p1 may be in contact with the supporting layer 126. In some embodiments, the portion 132p1 may be in contact with the sidewall 126s2 of the supporting layer 126. In some embodiments, the portion 132p1 may be in contact with the supporting layer 124. In some embodiments, the portion 132p1 may be in contact with the sidewall 124s1 of the supporting layer 124. In some embodiments, the portion 132p1 may be in contact with the supporting layer 122. In some embodiments, the portion 132p1 may be in contact with the sidewall 122s1 of the supporting layer 122.

The portion 132p2 may extend from the portion 132p1. In some embodiments, the portion 132p2 may be spaced apart from the supporting layer 126. In some embodiments, the portion 132p2 may be spaced apart from the supporting layer 124. In some embodiments, the portion 132p2 may be spaced apart from the supporting layer 122.

The lower electrode 132 may have a surface 132s1 and a surface 132s2. The surface 132s1 may be an upper surface of the portion 132p1 and located at a horizontal level L1. The surface 132s2 may be an upper surface of the portion 132p2 and located at a horizontal level L2. In some embodiments, the horizontal level L1 may be different from the horizontal level L2. In some embodiments, the horizontal level L1 may be higher than the horizontal level L2. The surface 132s1 of the lower electrode 132 may be substantially coplanar with the surface 126s1 of the supporting layer 126.

The portion 132p1 of the lower electrode 132 may have a vertical length H1. The portion 132p2 of the lower electrode 132 may have a vertical length H2. In some embodiments, the vertical length H1 may be different from the vertical length H2. In some embodiments, the vertical length H1 may be greater than the vertical length H2.

The capacitor dielectric 134 may be conformally disposed on the lower electrode 132. The capacitor dielectric 134 may be conformally disposed on the dielectric layer 114. The capacitor dielectric 134 may be formed on the supporting layer 122. The capacitor dielectric 134 may be formed on the supporting layer 124. The capacitor dielectric 134 may be formed on the supporting layer 126. The capacitor dielectric 134 may include silicon oxide, tungsten oxide, copper oxide, aluminum oxide, hafnium oxide, or the like.

The capacitor dielectric 134 may have a surface 134s1 located at a horizontal level L3. The capacitor dielectric 134 may have a surface 134s2 located at a horizontal level L4. In some embodiments, the horizontal level L3 may be different from the horizontal level L4. In some embodiments, the horizontal level L3 may be higher than the horizontal level L4. In some embodiments, the capacitor dielectric 134 may be in contact with the bottom 132b of the lower electrode 132.

The upper electrode 136 may be formed on the capacitor dielectric 134. The upper electrode 136 may be formed over the supporting layer 126. The upper electrode 136 may be spaced apart from the lower electrode 132 by the capacitor dielectric 134. In some embodiments, the upper electrode 136 may fill the opening R1. In some embodiments, the upper electrode 136 may fill the opening R2. In some embodiments, a portion of the upper electrode 136 may be disposed between the supporting layers 122 and 124. In some embodiments, a portion of the upper electrode 136 may be disposed between the supporting layers 122 and 126.

In some embodiments, the upper electrode 136 may have a surface 136s1 (or an upper surface). The surface 132s1 of the lower electrode 132 and the surface 136s1 of the upper electrode 136 may have a distance D1 therebetween. The surface 132s2 of the lower electrode 132 and the surface 136s1 of the upper electrode 136 may have a distance D2 therebetween. In some embodiments, the distance D1 may be different from the distance D2. In some embodiments, the distance D1 may be less than the distance D2.

The upper electrode 136 may include conductive material (s), such as doped poly silicon, conductive metal nitride (e.g., titanium nitride, tantalum nitride, tungsten nitride, or the like), metal (e.g., ruthenium, iridium, titanium, tantalum, or the like), and conductive metal oxide (e.g., iridium oxide or the like).

In this embodiment, the lower electrode (e.g., 132) may have different lengths. The capacitor dielectric (e.g., 134) may be disposed on the lower electrode. In this embodiment, the capacitor dielectric may be in contact with the bottom (e.g., 132b) of the lower electrode, which thereby increasing the capacitance of the semiconductor device. Such a structure may be formed by a semiconductor manufacturing process, which may improve the electrical property of the semiconductor device and will be discussed detaily later.

Figure 2A:
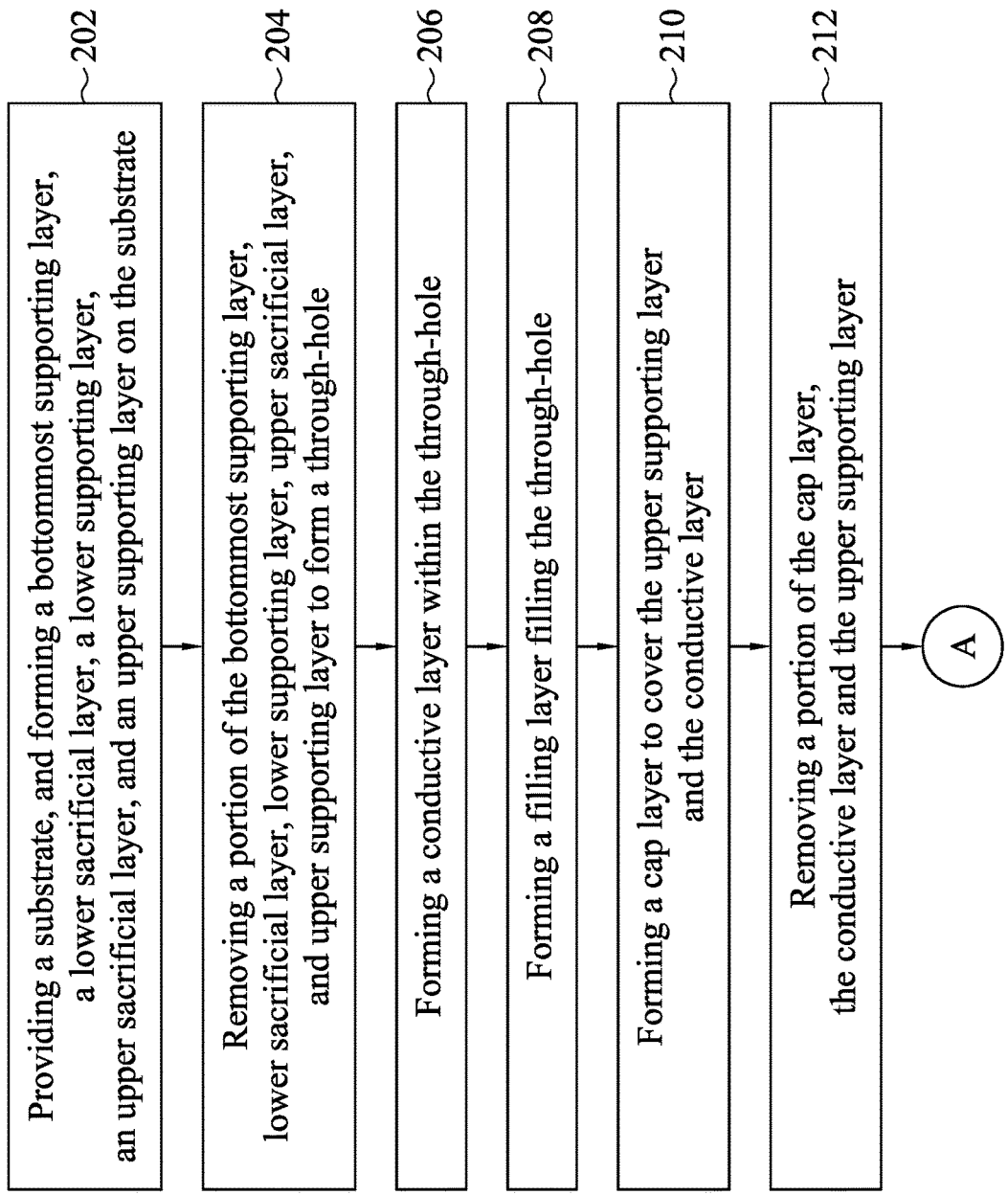
FIG. 2A and FIG. 2B are flowcharts illustrating a method of manufacturing a semiconductor device, in accordance with some embodiments of the present disclosure.
Figure 2B:
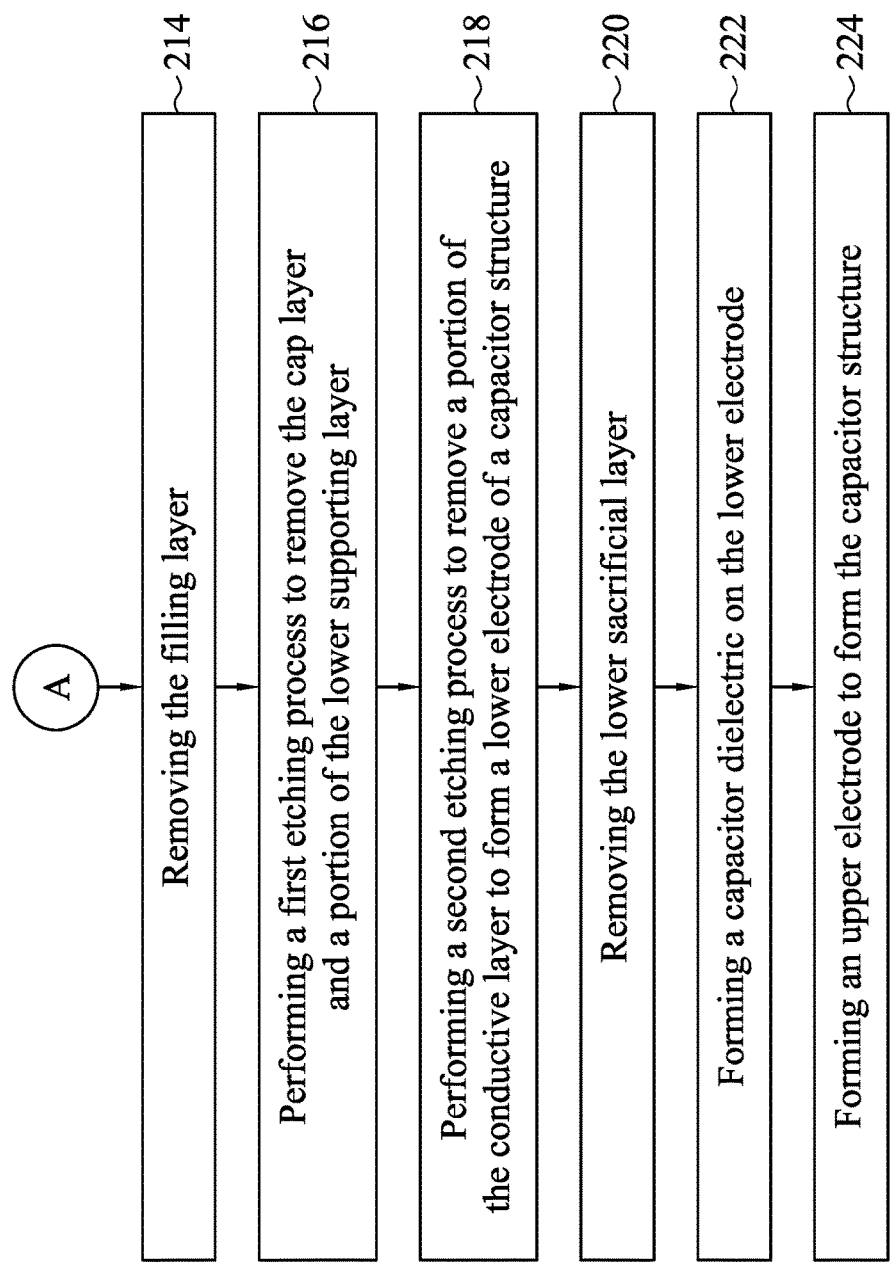

FIG. 2A and FIG. 2B are flowcharts illustrating a method 200 of manufacturing a semiconductor device, in accordance with some embodiments of the present disclosure.

Referring to FIG. 2A, the method 200 begins with operation 202 in which a substrate may be provided. A plurality of contact plugs may be formed on or within the substrate. An interlayer dielectric may be formed on or within the substrate to separate the plurality of contact plugs. In some embodiments, a bottommost supporting layer, a lower sacrificial layer, a lower supporting layer, an upper sacrificial layer, and an upper supporting layer may be formed on the substrate in order.

In some embodiments, the bottommost supporting layer may be formed on the contact plug and the interlayer dielectric. In some embodiments, the lower sacrificial layer may be formed on the bottommost supporting layer. In some embodiments, the lower supporting layer may be formed on the lower sacrificial layer. In some embodiments, the upper sacrificial layer may be formed on the lower supporting layer. In some embodiments, the upper supporting layer may be formed on the upper sacrificial layer. In some embodiments, the material of the lower sacrificial layer (or upper sacrificial layer) may be different from that of the bottommost supporting layer (or lower supporting layer or upper supporting layer).

The method 200 continues with operation 204 in which a through-hole may be formed. In some embodiments, a portion of the bottommost supporting layer, lower sacrificial layer, lower supporting layer, upper sacrificial layer, and upper supporting layer may be removed. In some embodiments, the through-hole may be utilized to define the ring profile of a lower electrode of a capacitor structure. In some embodiments, an etching process may be performed to form the recess.

The method 200 continues with operation 206 in which a conductive layer may be formed. The conductive layer may be utilized to form a lower electrode of a capacitor structure. In some embodiments, the conductive layer may be formed within the through-hole. In some embodiments, the conductive layer may be formed on an upper surface and on a sidewall of the upper supporting layer. In some embodiments, the conductive layer may be formed on a sidewall of the upper sacrificial layer. In some embodiments, the conductive layer may be formed on a sidewall of the lower supporting layer. In some embodiments, the conductive layer may be formed on a sidewall of the lower sacrificial layer. In some embodiments, the conductive layer may be formed on a sidewall of the bottommost supporting layer. In some embodiments, the conductive layer may be formed on the contact plug.

The method 200 continues with operation 208 in which a filling layer may be formed. In some embodiments, the filling layer may fill the through-hole. In some embodiments, the filling layer and the lower sacrificial layer (or upper sacrificial layer) may include the same material.

The method 200 continues with operation 210 in which a cap layer may be formed. In some embodiments, the cap layer may be formed over the upper supporting layer. In some embodiments, the cap layer may be formed over the conductive layer. In some embodiments, the cap layer may be formed over the filling layer.

The method 200 continues with operation 212 in which a portion of the cap layer, the conductive layer and the upper supporting layer may be removed. In some embodiments, a recess may be formed. In some embodiments, the filling layer may be exposed by the recess. In some embodiments, a portion of the upper sacrificial layer may be exposed by the recess. In some embodiments, a sidewall of the conductive layer may be exposed.

Referring to FIG. 2B, the method 200 continues with operation 214 in which the filling layer may be removed. In some embodiments, the upper sacrificial layer may be removed. In some embodiments, the upper surface of the lower supporting layer may be exposed. In some embodiments, a first opening may be formed. The first opening may be defined by the sidewall of the conductive layer. In some embodiments, a second opening may be formed. The second opening may be defined by the cap layer.

The method 200 continues with operation 216 in which a first etching process may be performed. In some embodiments, the cap layer may be removed. In some embodiments, the portion of the lower supporting layer exposed by the second opening may be removed. In some embodiments, the lower sacrificial layer may be exposed.

The method 200 continues with operation 218 in which a second etching process may be performed. In some embodiments, a portion of the conductive layer may be removed to form the lower electrode of a capacitor structure. In some embodiments, the portion of the conductive layer over the upper surface of the upper supporting layer may be removed.

The method 200 continues with operation 220 in which the lower sacrificial layer may be removed. In some embodiments, the bottommost supporting layer within the second opening may be removed.

The method 200 continues with operation 222 in which a capacitor dielectric may be formed. In some embodiments, the capacitor dielectric may be conformally formed on the lower electrode. In some embodiments, the capacitor dielectric may be conformally formed on the bottommost supporting layer. In some embodiments, the capacitor dielectric may be conformally formed on the lower supporting layer. In some embodiments, the capacitor dielectric may be conformally formed on the upper supporting layer. In some embodiments, the capacitor dielectric may be conformally formed on the interlayer dielectric.

The method 200 continues with operation 224 in which an upper electrode may be formed. In some embodiments, the upper electrode may be formed on the capacitor dielectric, thereby forming a capacitor structure. In some embodiments, the upper electrode may fill the first opening. In some embodiments, the upper electrode may fill the second opening. In some embodiments, the upper electrode may be formed between the lower supporting layer and upper supporting layer. In some embodiments, the upper electrode may be formed between the lower supporting layer and the bottommost supporting layer.

The method 200 is merely an example, and is not intended to limit the present disclosure beyond what is explicitly recited in the claims. Additional operations can be provided before, during, or after each operations of the method 200, and some operations described can be replaced, eliminated, or reordered for additional embodiments of the method. In some embodiments, the method 200 can include further operations not depicted in FIG. 2A and FIG. 2B. In some embodiments, the method 200 can include one or more operations depicted in FIG. 2A and FIG. 2B.

FIG. 3A, FIG. 3B, FIG. 3C, FIG. 3D, FIG. 3E, FIG. 3F, FIG. 3G, FIG. 3H, FIG. 3I, FIG. 3J, FIG. 3K, and FIG. 3L illustrate one or more stages of an example of a method for manufacturing a semiconductor device according to some embodiments of the present disclosure. In some embodiments, the semiconductor device 10 may be manufactured through the operations described with respect to FIG. 3A to FIG. 3L.

Figure 3A:
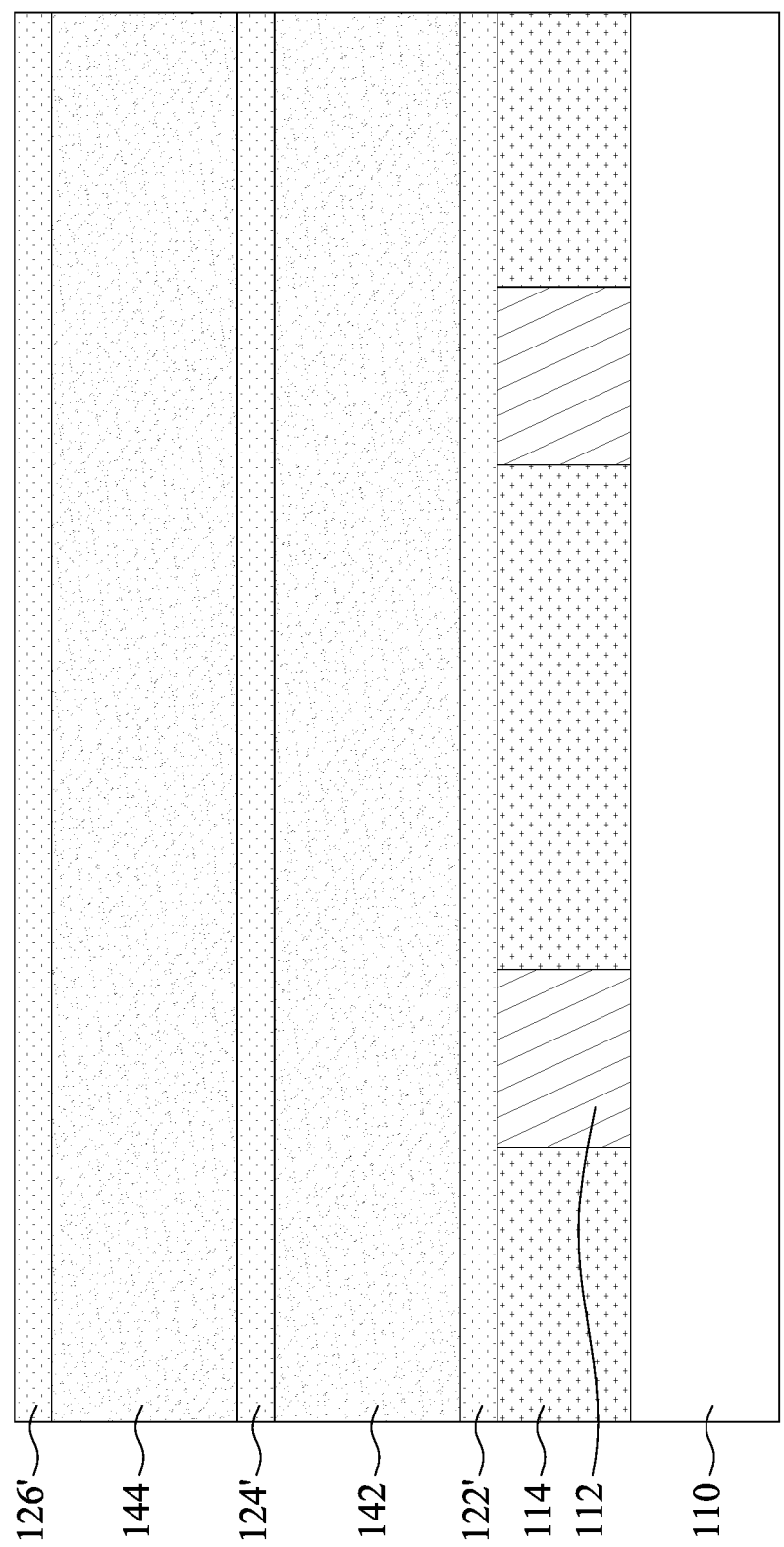
FIG. 3A illustrates one or more stages of an example of a method for manufacturing a semiconductor device according to some embodiments of the present disclosure.

Referring to FIG. 3A, a substrate 110 may be provided. A plurality of contact plug 112 may be formed on or within the substrate 110. A dielectric layer 114 may be formed on or within the substrate 110 to separate the plurality of contact plug 112. In some embodiments, a supporting layer 122' (or unpatterned supporting layer), a sacrificial layer 142, a supporting layer 124' (or unpatterned supporting layer), a sacrificial layer 144, and a supporting layer 126' (or unpatterned supporting layer) may be formed on the substrate 110. In some embodiments, the supporting layer 122' may be formed on the contact plug 112 and the dielectric layer 114. In some embodiments, the sacrificial layer 142 may be formed on the supporting layer 122'. In some embodiments, the supporting layer 124' may be formed on the sacrificial layer 142. In some embodiments, the sacrificial layer 144 may be formed on the supporting layer 124'. In some embodiments, the supporting layer 126' may be formed on the sacrificial layer 144. Each of the supporting layer 122', sacrificial layer 142, supporting layer 124', sacrificial layer 144, and supporting layer 126' may be formed by chemical vapor deposition (CVD), atomic layer deposition (ALD), physical vapor deposition (PVD), low-pressure chemical vapor deposition (LPCVD), plasma-enhanced CVD (PECVD) or other suitable processes.

The supporting layer 122', supporting layer 124' and supporting layer 126' may be utilized to form patterned supporting layers 122, 124, and 126, as shown in FIG. 1B, respectively.

Each of the sacrificial layers 142 and 144 may include, for example, silicon oxide ($SiO_2$), and for example, may include flowable oxide (FOX), tonen silazene (TOSZ), undoped silica glass (USG), borosilica glass (BSG), phosphosilica glass (PSG), borophosphosilica glass (BPSG), plasma enhanced tetra ethyl ortho silicate (PE-TEOS), fluoride silicate glass (FSG). In some embodiments, the sacrificial layers 142 and 144 may include the same material. In some embodiments, the material of the sacrificial layer 142 (or sacrificial layer 144) may be different from that of the supporting layer 122' (or supporting layer 124' or supporting layer 126'). For example, the sacrificial layers 142 and 144 may include silicon oxide, and the supporting layers 122', 124', and 126' may include silicon nitride. However, the present disclosure is not intended to be limiting.

Figure 3B:
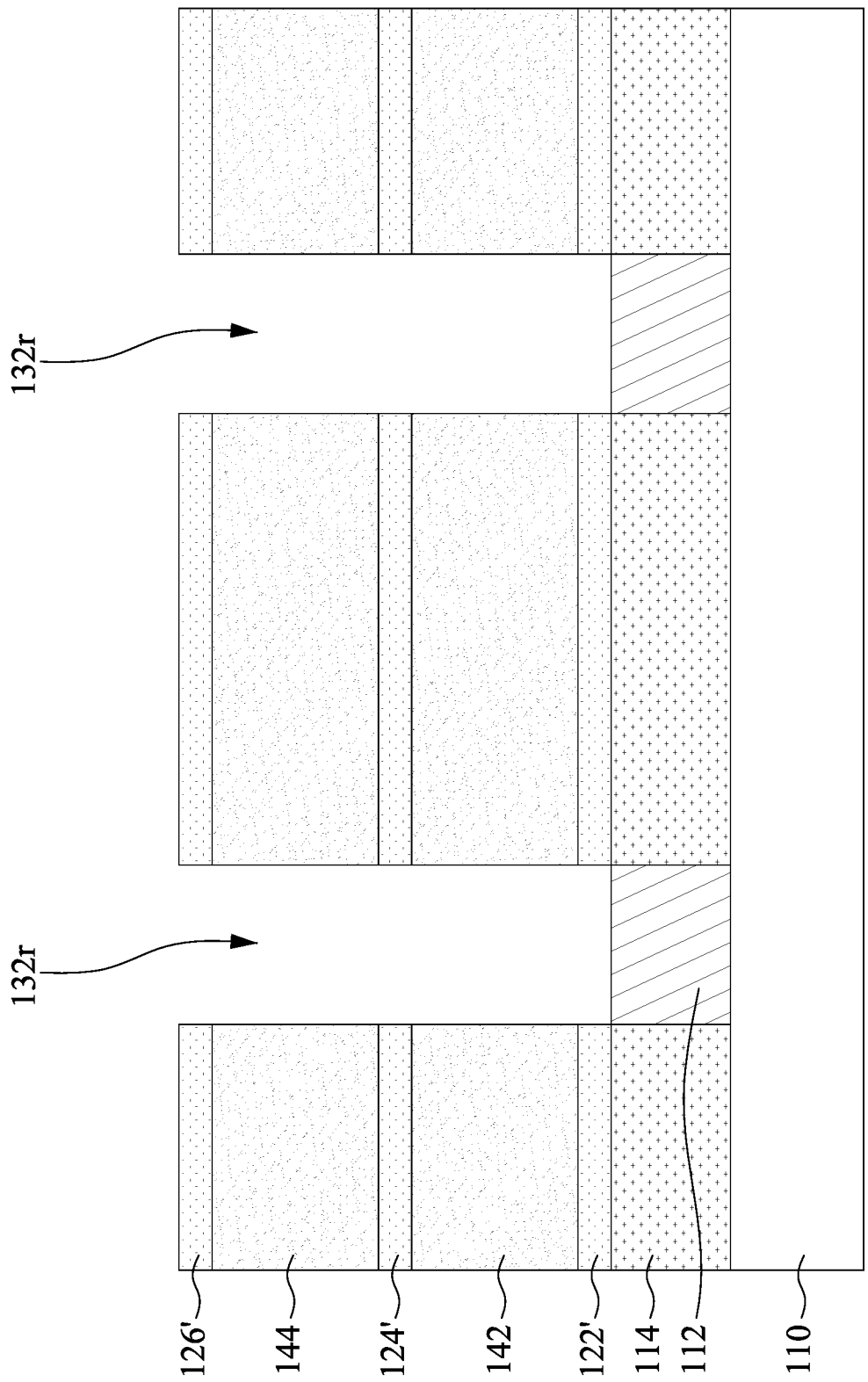
FIG. 3B illustrates one or more stages of an example of a method for manufacturing a semiconductor device according to some embodiments of the present disclosure.

Referring to FIG. 3B, a through-hole 132r may be formed. In some embodiments, a portion of the supporting layer 122', sacrificial layer 142, supporting layer 124', sacrificial layer 144, and supporting layer 126' may be removed. In some embodiments, the through-hole 132r may be utilized to define the ring of a lower electrode of a capacitor structure.

Figure 3C:
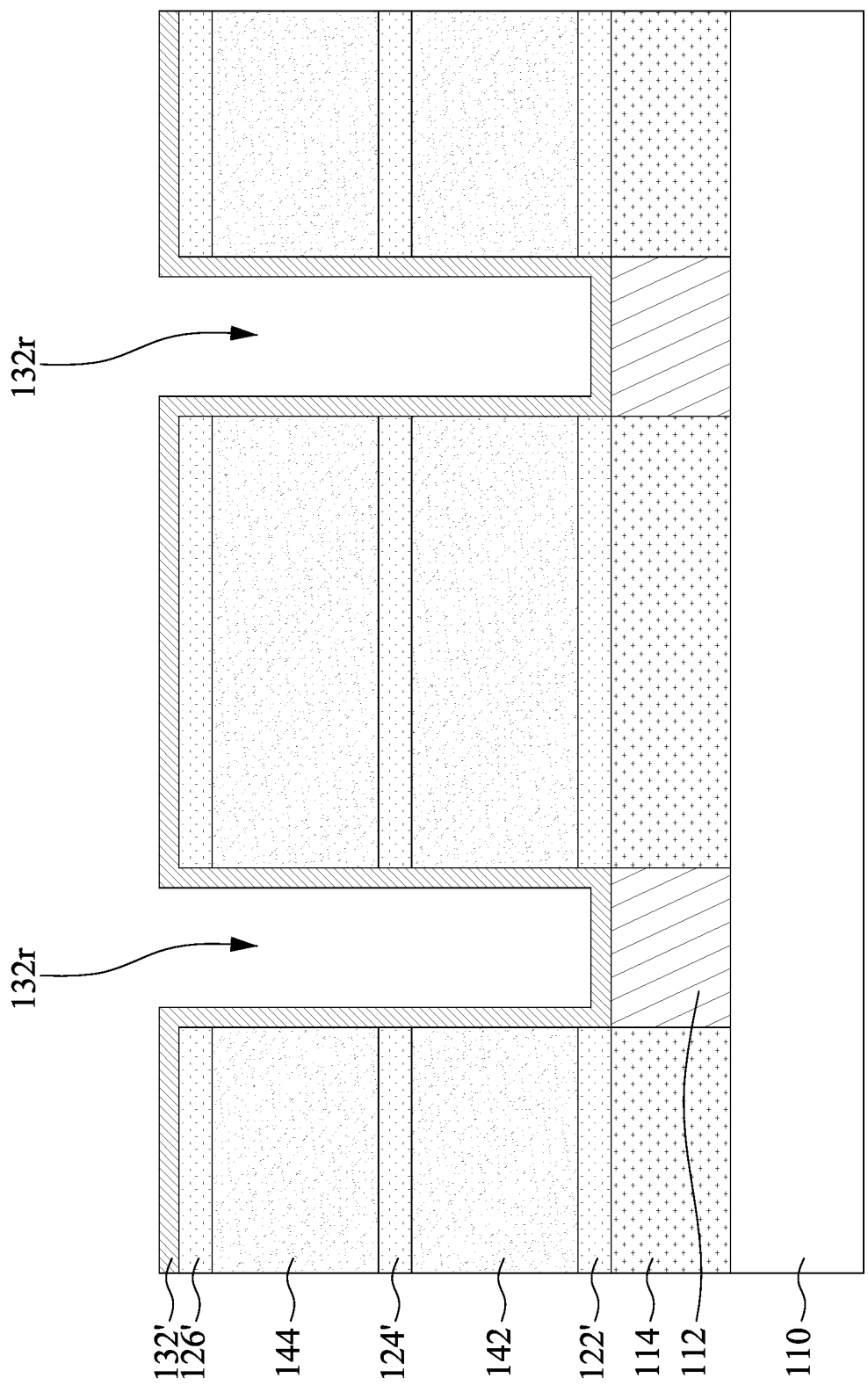
FIG. 3C illustrates one or more stages of an example of a method for manufacturing a semiconductor device according to some embodiments of the present disclosure.

Referring to FIG. 3C, a conductive layer 132' may be formed. The conductive layer 132' may be utilized to form a lower electrode of a capacitor structure. In some embodiments, the conductive layer 132' may be formed on an upper surface (not annotated in the figures) and a sidewall (not annotated in the figures) of the supporting layer 126'. In some embodiments, the conductive layer 132' may be formed on a sidewall (not annotated in the figures) of the sacrificial layer 144. In some embodiments, the conductive layer 132' may be formed on a sidewall (not annotated in the figures) of the supporting layer 124'. In some embodiments, the conductive layer 132' may be formed on a sidewall (not annotated in the figures) of the sacrificial layer 142. In some embodiments, the conductive layer 132' may be formed on a sidewall (not annotated in the figures) of the supporting layer 122'. In some embodiments, the conductive layer 132' may be formed on the contact plug 112. In some embodiments, the conductive layer 132' may be formed by ALD, CVD, PVD, LPCVD, PECVD, or other suitable processes.

Figure 3D:
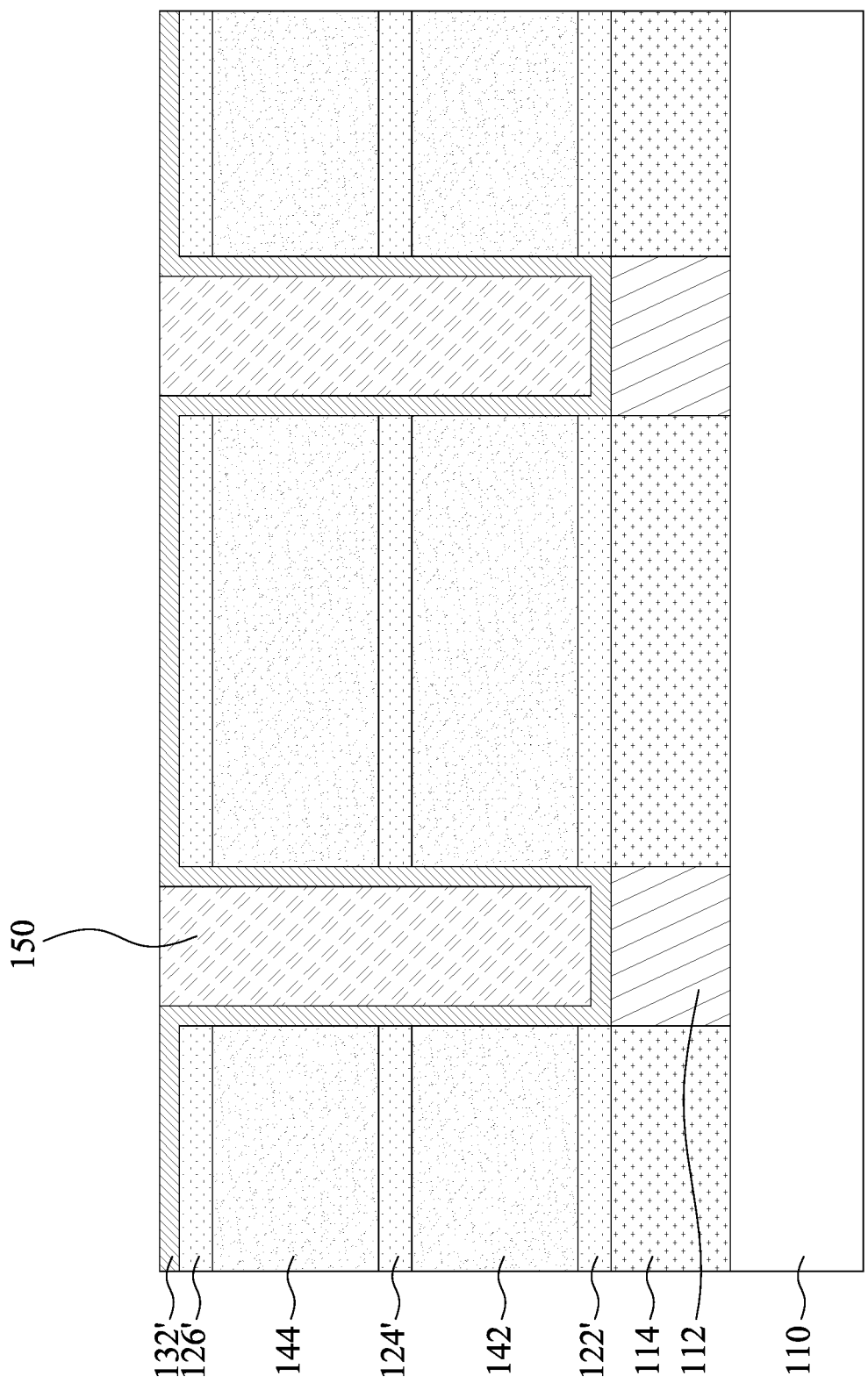
FIG. 3D illustrates one or more stages of an example of a method for manufacturing a semiconductor device according to some embodiments of the present disclosure.

Referring to FIG. 3D, a filling layer 150 may be formed. In some embodiments, the filling layer 150 may fill the through-hole 132r. The filling layer 150 may include, for example, silicon oxide ($SiO_2$), silicon nitride ($Si_3N_4$), silicon oxynitride ($N_2OSi_2$), silicon nitride oxide ($N_2OSi_2$), a high-k material or combinations thereof. In some embodiments, the filling layer 150 and the sacrificial layer 142 (or sacrificial layer 144) may include the same material, such as silicon oxide. The filling layer 150 may be formed by CVD, PVD, ALD, LPCVD, PECVD, or other suitable processes. A chemical mechanical polishing process may be performed so that the upper surface (not annotated in the figures) of the filling layer 150 and the upper surface (not annotated in the figures) of the conductive layer 132' may be substantially coplanar.

Figure 3E:
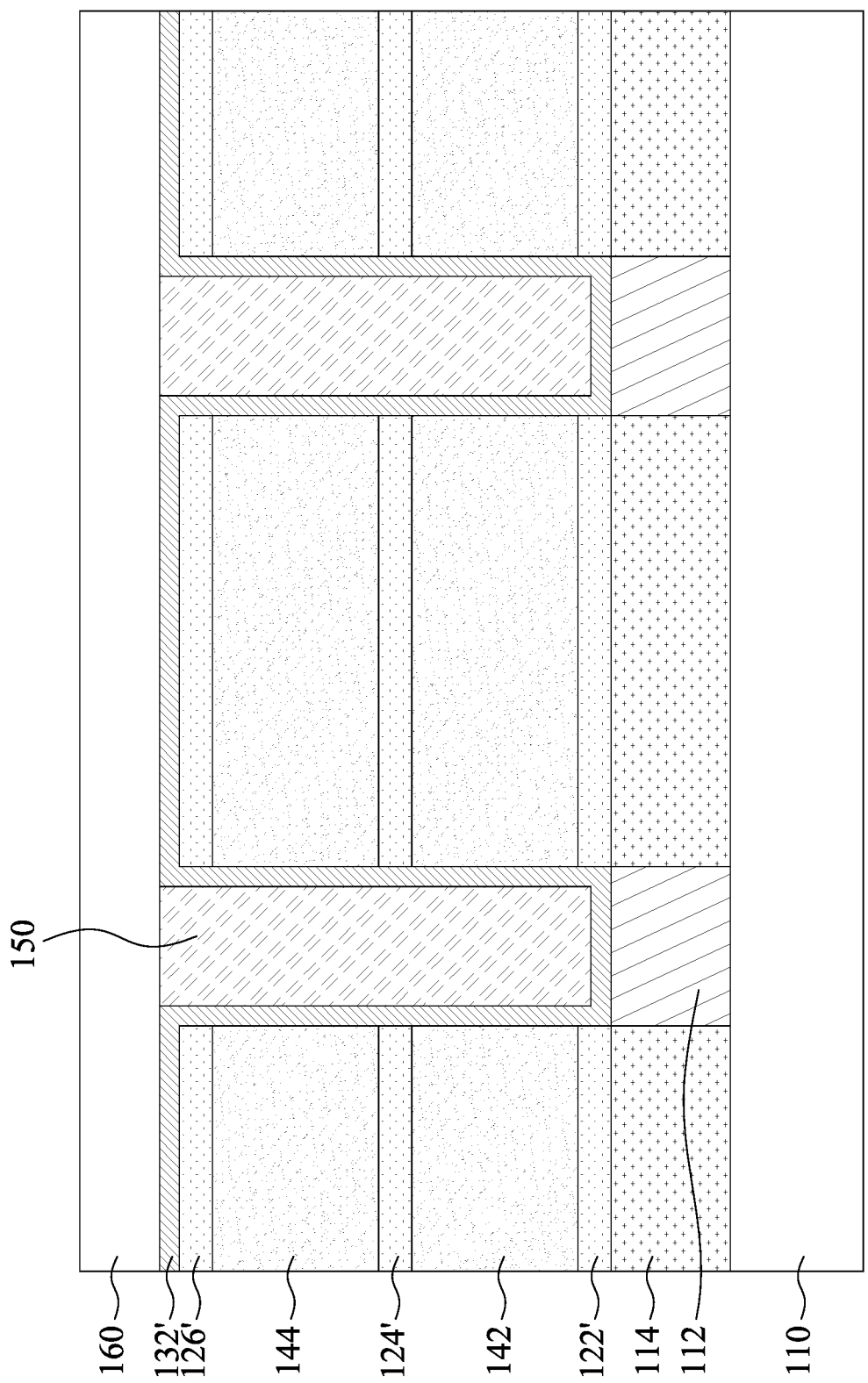
FIG. 3E illustrates one or more stages of an example of a method for manufacturing a semiconductor device according to some embodiments of the present disclosure.

Referring to FIG. 3E, a cap layer 160 may be formed. In some embodiments, the cap layer 160 may be formed over the conductive layer 132'. In some embodiments, the cap layer 160 may be formed over the filling layer 150. The cap layer 160 may include, for example, silicon oxide ($SiO_2$), silicon nitride ($Si_3N_4$), silicon oxynitride ($N_2OSi_2$), silicon nitride oxide ($N_2OSi_2$), a high-k material or combinations thereof. In some embodiments, the cap layer 160 and the supporting layer 122' (or supporting layer 124' or supporting layer 126') may include the same material, such as silicon nitride. The cap layer 160 may be formed by CVD, PVD, ALD, LPCVD, PECVD, or other suitable processes.

Figure 3F:
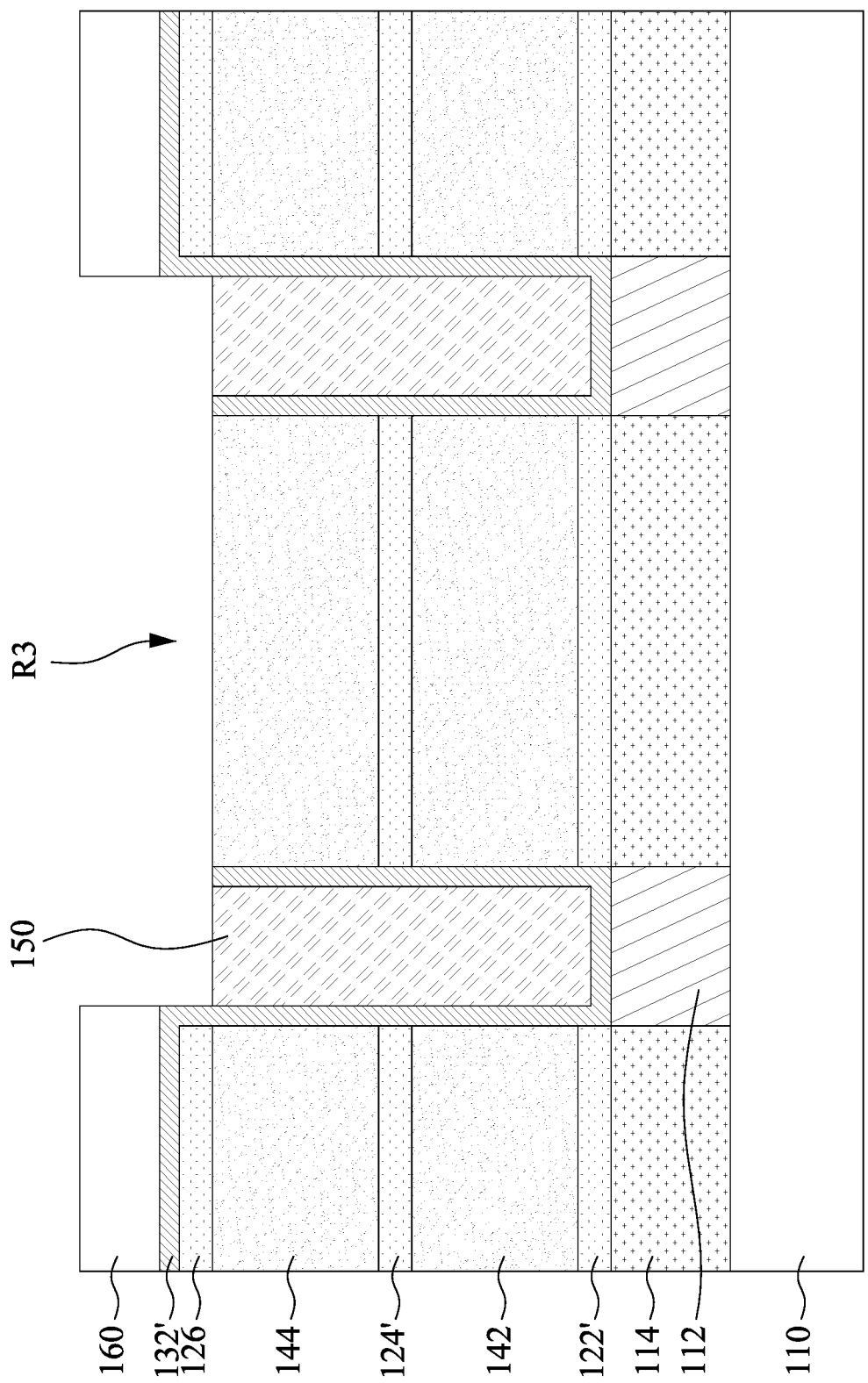
FIG. 3F illustrates one or more stages of an example of a method for manufacturing a semiconductor device according to some embodiments of the present disclosure.

Referring to FIG. 3F, a portion of the cap layer 160, the conductive layer 132' and the supporting layer 126' may be removed. In some embodiments, a recess R3 may be formed. In some embodiments, the filling layer 150 may be exposed by the recess R3. In some embodiments, a portion of the sacrificial layer 144 may be exposed by the recess R3. In some embodiments, the supporting layer 126' may be patterned to form the supporting layer 126. In some embodiments, a sidewall of the conductive layer 132' may be exposed.

Figure 3G:
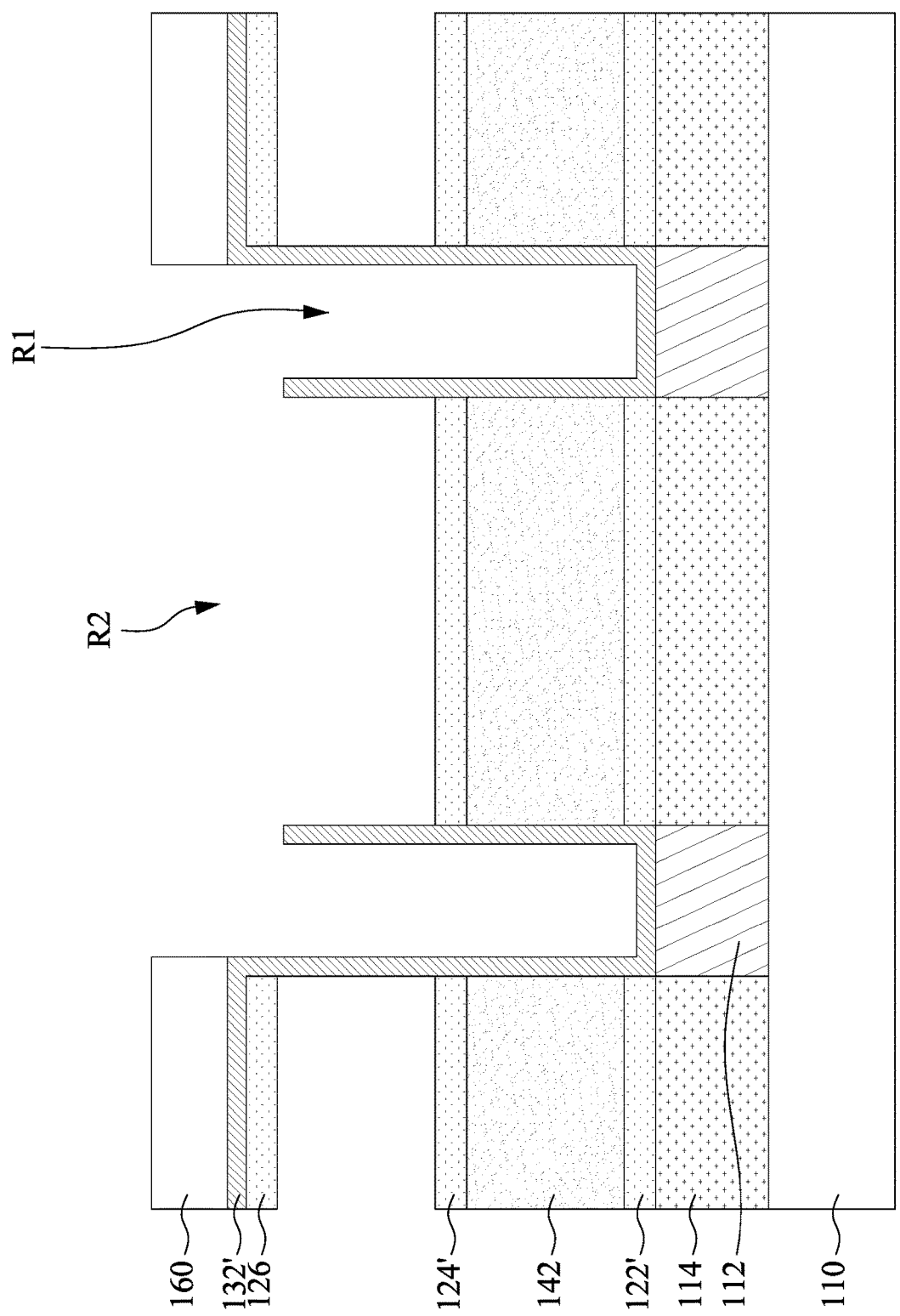
FIG. 3G illustrates one or more stages of an example of a method for manufacturing a semiconductor device according to some embodiments of the present disclosure.

Referring to FIG. 3G, the filling layer 150 may be removed. In some embodiments, the sacrificial layer 144 may be removed. In some embodiments, the upper surface (not annotated in the figures) of the supporting layer 124' may be exposed. In some embodiments, an opening R1 may be formed. The opening R1 may be defined by the conductive layer 132'. In some embodiments, an opening R2 may be formed. The opening R2 may be defined by the cap layer 160 or by the supporting layer 126.

Figure 3H:
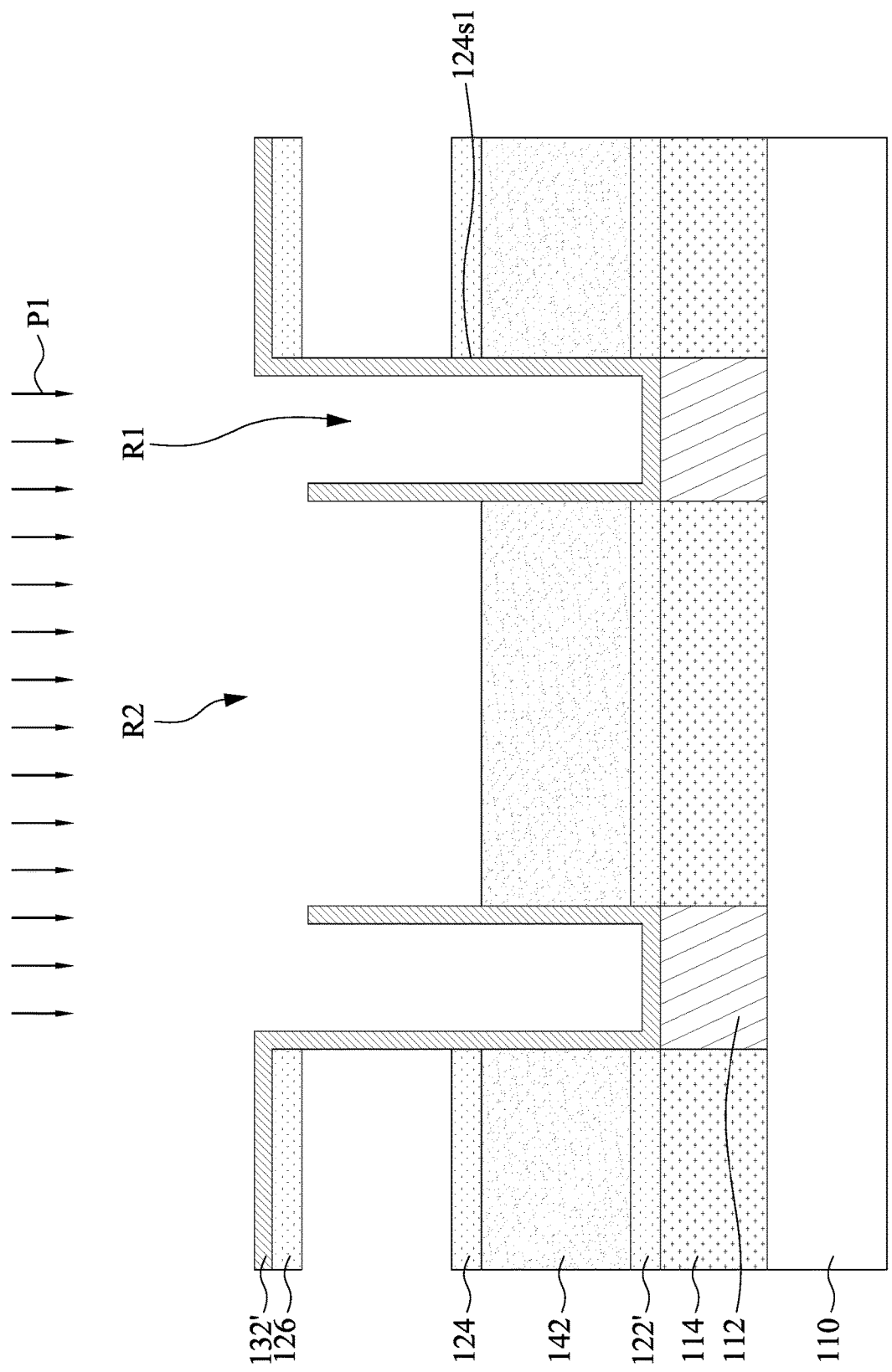
FIG. 3H illustrates one or more stages of an example of a method for manufacturing a semiconductor device according to some embodiments of the present disclosure.

Referring to FIG. 3H, an etching process P1 may be performed. In some embodiments, the cap layer 160 may be removed. In some embodiments, a portion of the supporting layer 124' may be removed to form the supporting layer 124. In some embodiments, the portion of the supporting layer 124' exposed by the opening R2 may be removed. In some embodiments, the sacrificial layer 142 may be exposed. In some embodiments, the etchant and/or the carrier gas of the etching process P1 may include chlorine, oxygen, argon, a combination thereof, and other suitable etchants.

Figure 3I:
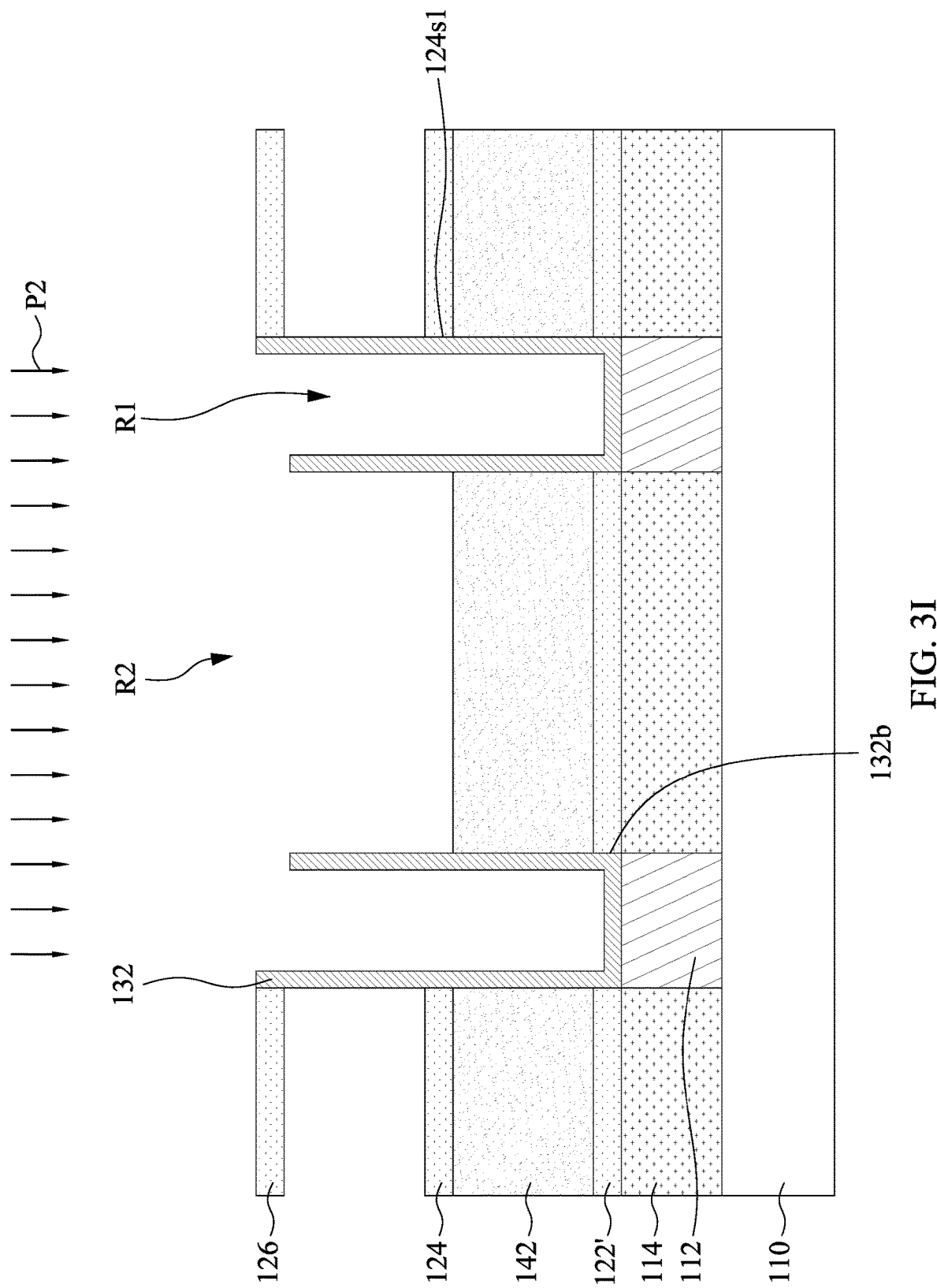
FIG. 3I illustrates one or more stages of an example of a method for manufacturing a semiconductor device according to some embodiments of the present disclosure.

Referring to FIG. 3I, an etching process P2 may be performed. In some embodiments, a portion of the conductive layer 132' may be removed to form the lower electrode 132. In some embodiments, the portion of the conductive layer 132' over the upper surface of the supporting layer 126 may be removed. In some embodiments, the etchant and/or the carrier gas of the etching process P2 may include boron, chlorine, a combination thereof, and other suitable etchants.

In some embodiments, the etching processes P1 and P2 may be performed in the same chamber of a semiconductor fabricating tool.

Figure 3J:
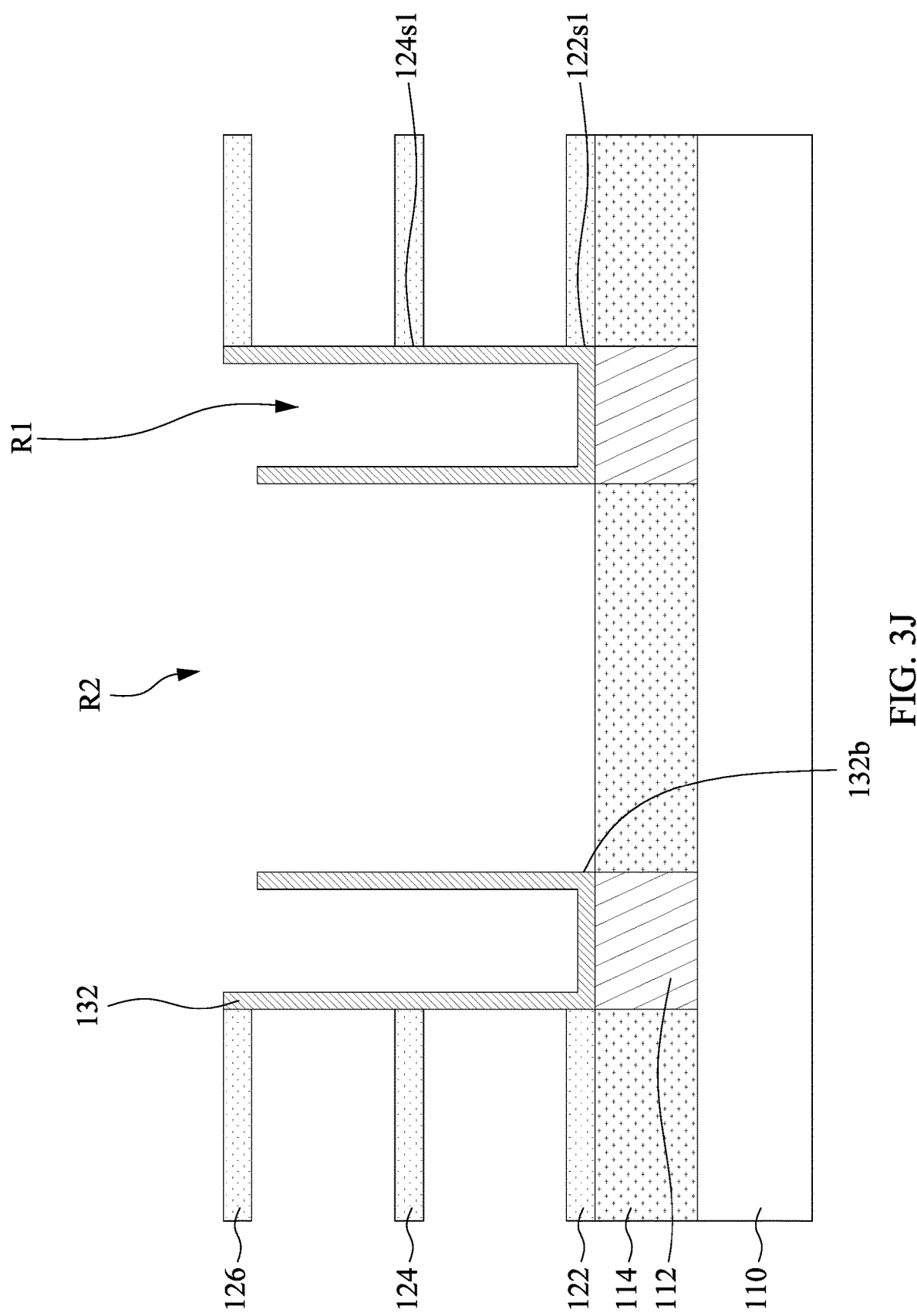
FIG. 3J illustrates one or more stages of an example of a method for manufacturing a semiconductor device according to some embodiments of the present disclosure.

Referring to FIG. 3J, the sacrificial layer 142 may be removed. In some embodiments, the supporting layer 122' within the opening R2 may be removed to form the supporting layer 122.

Figure 3K:
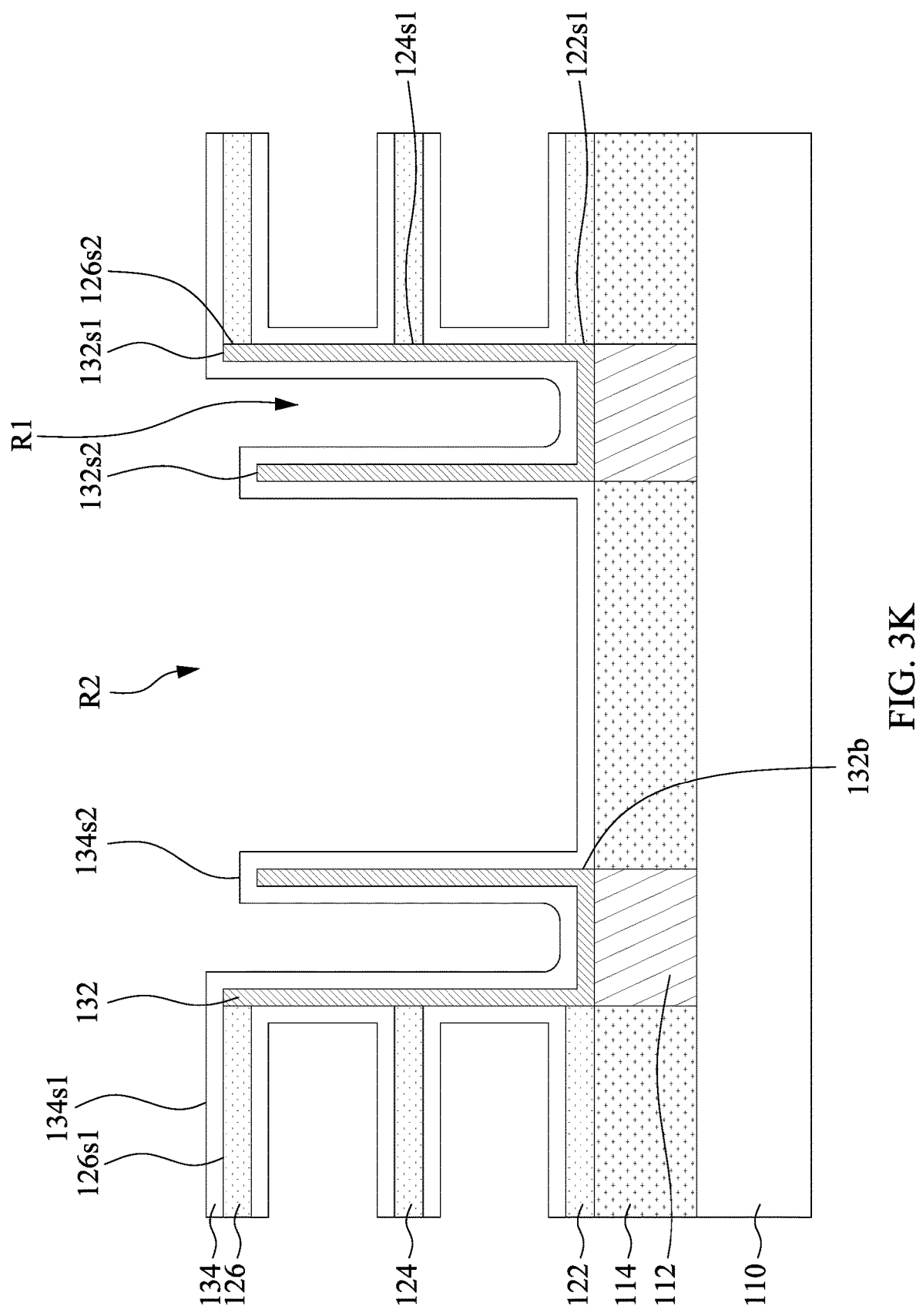
FIG. 3K illustrates one or more stages of an example of a method for manufacturing a semiconductor device according to some embodiments of the present disclosure.

Referring to FIG. 3K, a capacitor dielectric 134 may be formed. In some embodiments, the capacitor dielectric 134 may be conformally formed on the lower electrode 132. In some embodiments, the capacitor dielectric 134 may be conformally formed on the supporting layer 122. In some embodiments, the capacitor dielectric 134 may be conformally formed on the supporting layer 124. In some embodiments, the capacitor dielectric 134 may be conformally formed on the supporting layer 126. The capacitor dielectric 134 may be formed by ALD, CVD, PVD, LPCVD, PECVD, or other suitable processes.

Figure 3L:
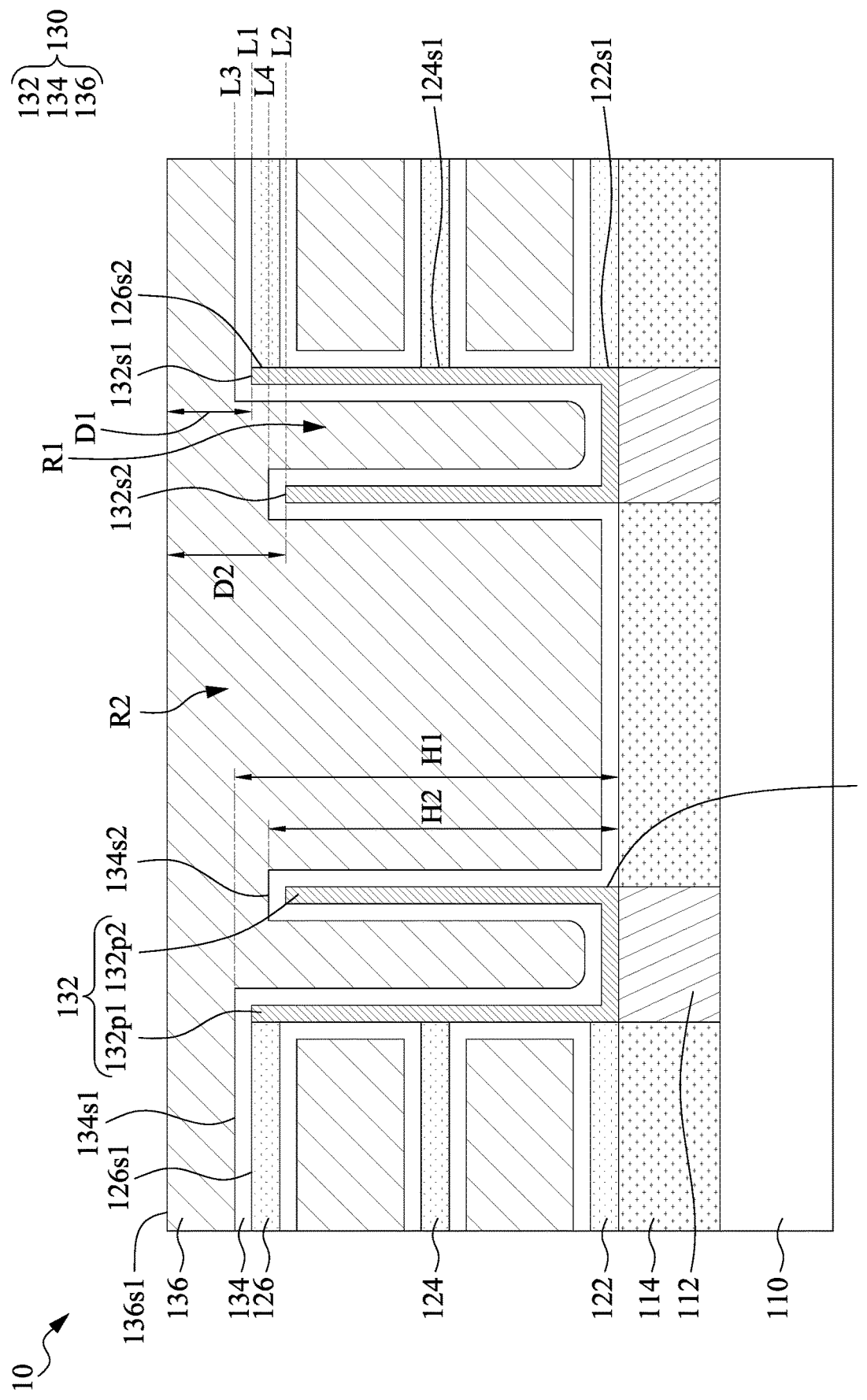
FIG. 3L illustrates one or more stages of an example of a method for manufacturing a semiconductor device according to some embodiments of the present disclosure.

Referring to FIG. 3L, an upper electrode 136 may be formed, which thereby produces the semiconductor device, such as the semiconductor device 10 as shown in FIG. 1A and FIG. 1B. In some embodiments, the upper electrode 136 may be formed on the capacitor dielectric 134. In some embodiments, the upper electrode 136 may fill the opening R1. In some embodiments, the upper electrode 136 may fill the opening R2. In some embodiments, the upper electrode 136 may be formed between the supporting layers 122 and 124. In some embodiments, the upper electrode 136 may be formed between the supporting layers 124 and 126.

FIG. 4 is a flowchart illustrating a method of manufacturing a semiconductor device, in accordance with some embodiments of the present disclosure.

In some embodiments, operation 216 may further include operation 2161. The operation 2161 may include imposing a first temperature on a central region of the substrate and a second temperature, different from the first temperature, on a peripheral region of the substrate.

Figure 5A:
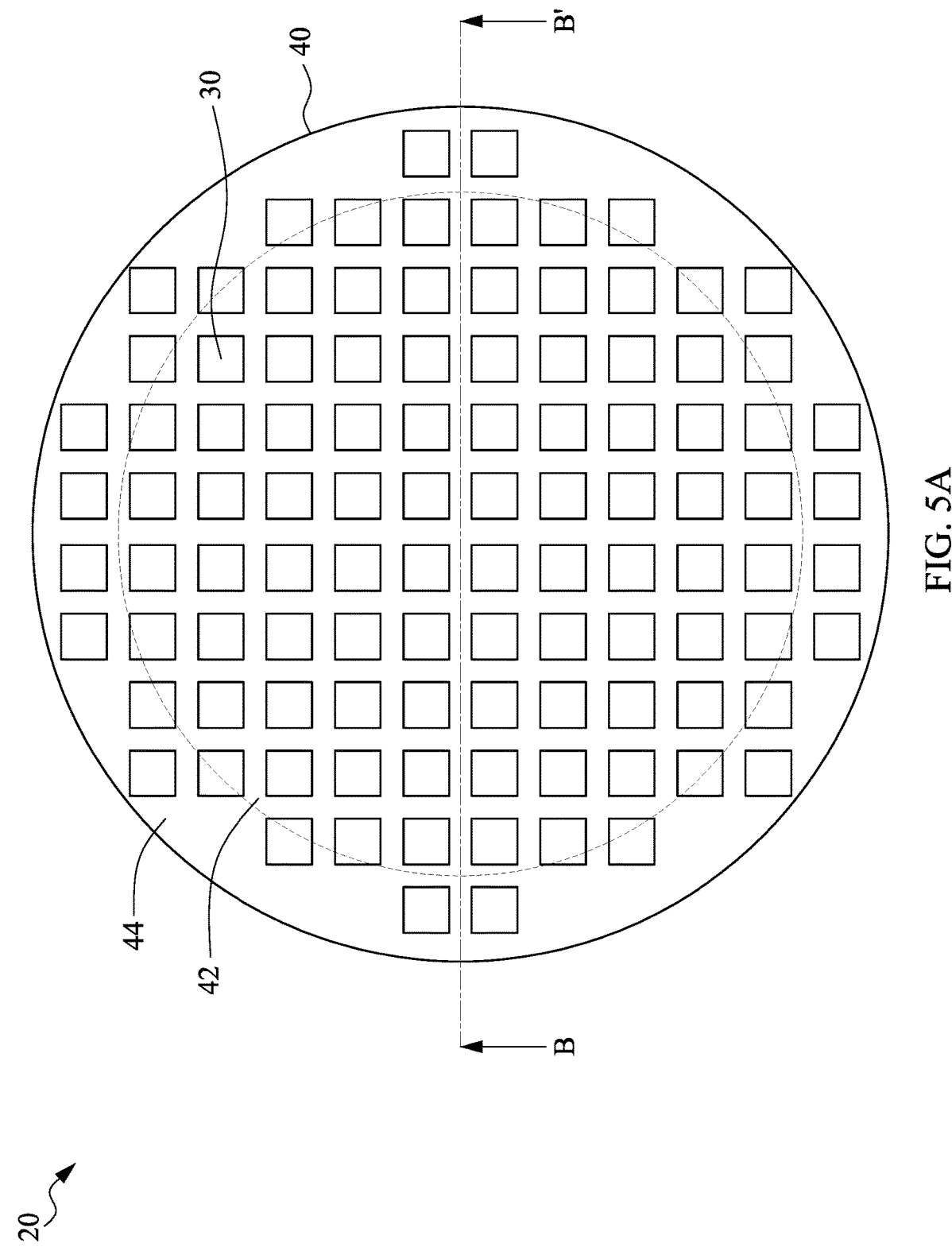
FIG. 5A is a top view of a semiconductor device, in accordance with some embodiments of the present disclosure.

FIG. 5A is a top view of a semiconductor device 20, in accordance with some embodiments of the present disclosure. In some embodiments, the semiconductor device 20 may include a plurality of dies 30. Each of the dies 30 may include semiconductor devices, such as a memory die (e.g., dynamic random access memory (DRAM) die, a static random access memory (SRAM) die, etc.), a power management die (e.g., power management integrated circuit (PMIC) die), a logic die (e.g., system-on-a-chip (SoC), central processing unit (CPU), graphics processing unit (CPU), application processor (AP), microcontroller, etc.), a radio frequency (RF) die, a sensor die, a micro-electro-mechanical-system (MEMS) die, a signal processing die (e.g., digital signal processing (DSP) die), a front-end die (e.g., analog front-end (AFE) dies) or other active components. Each of the dies 30 may include a plurality of capacitor structures, such as the capacitor structure 130 as shown in FIG. 1B.

The semiconductor device 20 may include a substrate 40. The substrate 40 may include a central region 42 and a peripheral region 44 surrounding the central region 42. The dies 30 may be disposed on the central region 42 and on the peripheral region 44.

Figure 5B:
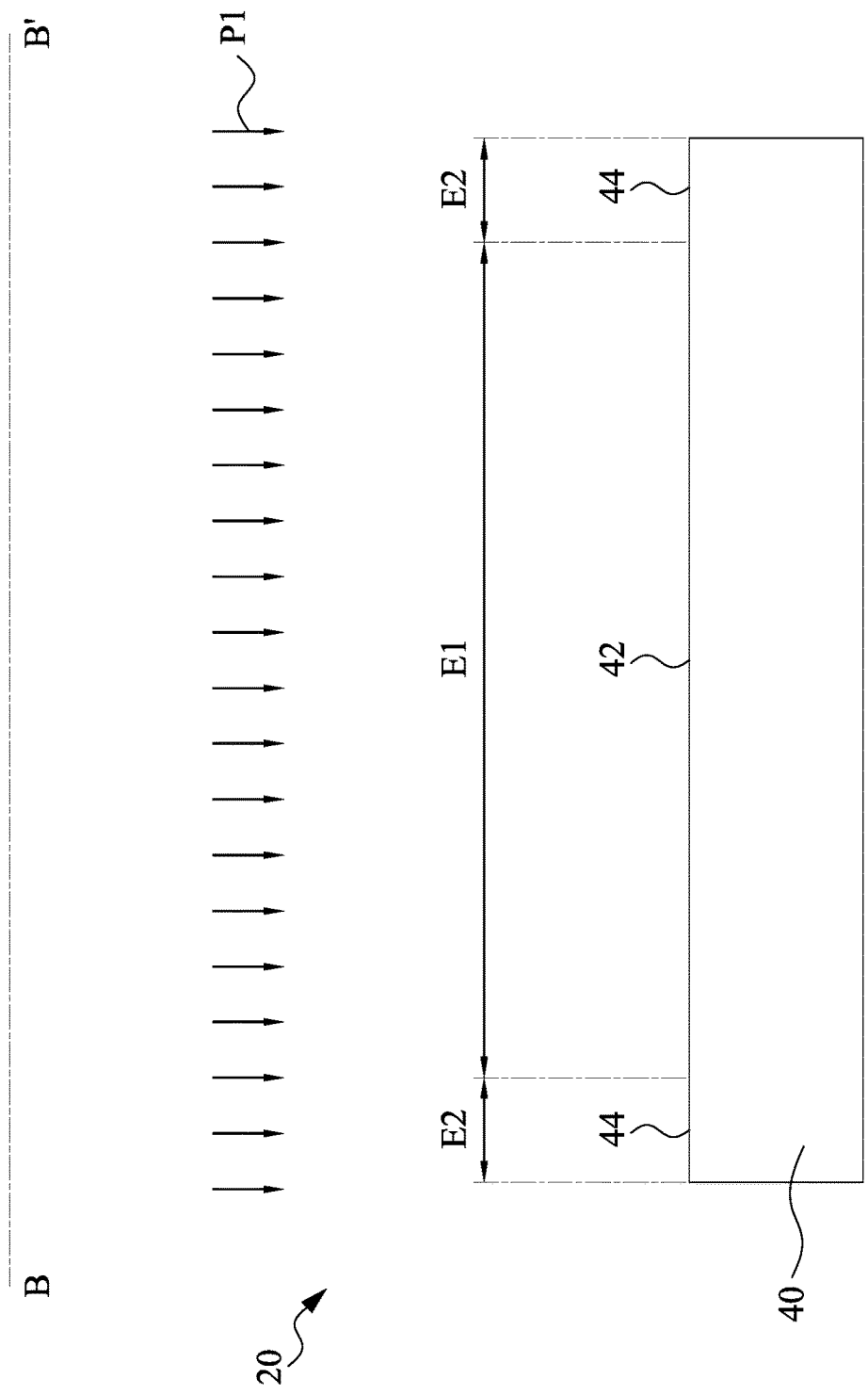
FIG. 5B illustrates a cross-sectional view along line B-B' of one or more stages of an example of a method for manufacturing a semiconductor device according to some embodiments of the present disclosure.

FIG. 5B illustrates a cross-sectional view along line B-B' of one or more stages of an example of a method for manufacturing a semiconductor device according to some embodiments of the present disclosure.

In some embodiments, during the etching process P1, a temperature E1 may impose on the central region 42 of the substrate and a temperature E2 may impose on the peripheral region 44 of the substrate 40. In some embodiments, the temperature E1 may be different form the temperature T2. In some embodiments, the temperature E2 may be higher than the temperature E1. In some embodiments, the current (or electrical field), utilized to generate plasma, in the semiconductor fabricating tool may be adjusted to optimize the process condition. In some embodiments, the concentration of the carrier gas in the semiconductor fabricating tool may be adjusted to optimize the process condition.

During the etching process P1, the etching rate may depend on the temperature imposing on the substrate 40. In a comparative example, during the etching process, the temperature imposing on the substrate may be relatively uniform, causing a different etching rate between the central region and peripheral region due to loading effect. Such a different etching rate may result in a residue of the lower supporting layer in an undesired region. The residue of the lower supporting layer may cause the lower sacrificial layer to be removed incompletely, negatively affecting the capacitance of the semiconductor device. In embodiments of this disclosure, different temperatures impose on the central region and on the peripheral region of the substrate. Therefore, the etching rate of the lower supporting layer in the central region and on the peripheral region of the substrate may be optimized. As a result, the lower sacrificial layer can be removed more completely, which thereby improves the capacitance of the semiconductor device.

One aspect of the present disclosure provides a semiconductor device. The semiconductor device includes a substrate, a lower supporting layer, an upper supporting layer, and a lower electrode. The lower supporting layer is disposed on the substrate. The upper supporting layer is disposed on the lower supporting layer. The upper supporting layer defines an opening. The lower electrode is disposed within the opening of the upper supporting layer. The lower electrode has a first portion with a first vertical length and a second portion with a second vertical length different from the first vertical length.

Another aspect of the present disclosure provides another method of manufacturing a semiconductor device. The semiconductor device includes a substrate, a lower supporting layer, an upper supporting layer, and a lower electrode. The lower supporting layer is disposed on the substrate. The upper supporting layer is disposed on the lower supporting layer. The upper supporting layer defines an opening. The lower electrode is disposed within the opening of the upper supporting layer. The lower electrode has a first upper surface at a first horizontal level and a second upper surface at a second horizontal level different from the first horizontal level.

Another aspect of the present disclosure provides a method of manufacturing a semiconductor device. The method includes: providing a substrate, wherein the substrate comprises a central region and a peripheral region surrounding the central region; forming a lower sacrificial layer, a lower supporting layer, an upper sacrificial layer, and an upper supporting layer on the substrate; forming an opening defined by the lower sacrificial layer, the lower supporting layer, the upper sacrificial layer, and the upper supporting layer; forming a conductive layer on the upper supporting layer and within the opening; forming a cap layer over the conductive layer, wherein the cap layer defines an opening exposing the upper sacrificial layer; removing the upper sacrificial layer to expose the lower supporting layer; and performing an etching process to remove the lower supporting layer, wherein the peripheral region of the substrate is imposed on a first temperature, and the central region of the substrate is imposed on a second temperature different form the first temperature.

The embodiments of the present disclosure provide a semiconductor device. The semiconductor device may include a lower electrode of a capacitor structure. The lower electrode may include a first portion and a second portion with different vertical lengths. The capacitor structure may include a capacitor dielectric on the lower electrode. In this embodiment, the capacitor dielectric may be in contact with the bottom of the lower electrode, which thereby increasing the capacitance of the semiconductor device.

Although the present disclosure and its advantages have been described in detail, it should be understood that various changes, substitutions and alterations can be made herein without departing from the spirit and scope of the disclosure as defined by the appended claims. For example, many of the processes discussed above can be implemented in different methodologies and replaced by other processes, or a combination thereof.

Moreover, the scope of the present application is not intended to be limited to the particular embodiments of the process, machine, manufacture, and composition of matter, means, methods and steps described in the specification. As one of ordinary skill in the art will readily appreciate from the present disclosure, processes, machines, manufacture, compositions of matter, means, methods, or steps, presently existing or later to be developed, that perform substantially the same function or achieve substantially the same result as the corresponding embodiments described herein may be utilized according to the present disclosure. Accordingly, the appended claims are intended to include within their scope such processes, machines, manufacture, compositions of matter, means, methods, or steps.

What is claimed is:

1. A method of manufacturing a semiconductor device, comprising:
   providing a substrate including a central region and a peripheral region adjacent to the central region;
   forming a lower sacrificial layer, a lower supporting layer, an upper sacrificial layer and an upper supporting layer on the substrate;
   forming an through-hole defined by the lower sacrificial layer, the lower supporting layer, the upper sacrificial layer, and the upper supporting layer;
   forming a conductive layer on the upper supporting layer and within the through-hole;
   forming a cap layer over the conductive layer, wherein the cap layer defines an recess exposing the upper sacrificial layer;
   removing the upper sacrificial layer to expose the lower supporting layer; and
   performing an etching process to remove the lower supporting layer, wherein the peripheral region of the substrate is imposed on a first temperature, and the central region of the substrate is imposed on a second temperature different form the first temperature.

2. The method of claim 1, wherein the first temperature is higher than the second temperature.

3. The method of claim 1, wherein performing the etching process further comprises removing the cap layer to expose the conductive layer.

4. The method of claim 3, further comprising:
   removing the conductive layer over the upper supporting layer to form a lower electrode of a capacitor structure.

5. The method of claim 1, further comprising:
   removing a portion of the conductive layer and a portion of the upper supporting layer within the opening of the cap layer.

6. The method of claim 1, further comprising:
   forming a filling layer on the conductive layer and within the through-hole.

7. The method of claim 1, wherein the filling layer is removed before performing the etching process.

* * * * *